US011652156B2

United States Patent
Xie et al.

(10) Patent No.: US 11,652,156 B2
(45) Date of Patent: May 16, 2023

(54) NANOSHEET TRANSISTOR WITH ASYMMETRIC GATE STACK

(71) Applicant: International Business Machines Corporation, Armonk, NY (US)

(72) Inventors: Ruilong Xie, Niskayuna, NY (US); Carl Radens, LaGrangeville, NY (US); Kangguo Cheng, Schenectady, NY (US); Juntao Li, Cohoes, NY (US); Dechao Guo, Niskayuna, NY (US); Tao Li, Albany, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/506,742

(22) Filed: Oct. 21, 2021

(65) Prior Publication Data

US 2022/0045193 A1   Feb. 10, 2022

Related U.S. Application Data

(63) Continuation of application No. 16/876,443, filed on May 18, 2020, now Pat. No. 11,251,288.

(51) Int. Cl.
*H01L 29/66* (2006.01)
*H01L 29/06* (2006.01)
(Continued)

(52) U.S. Cl.
CPC ...... *H01L 29/6656* (2013.01); *H01L 29/0665* (2013.01); *H01L 29/42376* (2013.01); *H01L 29/66553* (2013.01); *H01L 29/785* (2013.01)

(58) Field of Classification Search
CPC ............. H01L 29/6656; H01L 29/0665; H01L 29/42376; H01L 29/66553; H01L 29/785;
(Continued)

(56) References Cited

U.S. PATENT DOCUMENTS

| 9,362,355 B1 | 6/2016 | Cheng et al. |
| 9,614,056 B2 | 4/2017 | Xie et al. |

(Continued)

FOREIGN PATENT DOCUMENTS

| CN | 106449755 A | 2/2017 |
| CN | 109494157 A | 3/2019 |
| CN | 106030815 B | 1/2020 |

OTHER PUBLICATIONS

Clarke, "Here comes the forksheet transistor," eeNews, May 20, 2019, downloaded from the Internet Aug. 15, 2019, https://www.eenewsanalog.com/news/here-comes-forksheet-transistor-says-imec.

(Continued)

*Primary Examiner* — Karen Kusumakar
*Assistant Examiner* — Adam S Bowen
(74) *Attorney, Agent, or Firm* — Cantor Colburn LLP; Daniel Yeates

(57) ABSTRACT

Embodiments of the present invention are directed to methods and resulting structures for nanosheet devices having asymmetric gate stacks. In a non-limiting embodiment of the invention, a nanosheet stack is formed over a substrate. The nanosheet stack includes alternating semiconductor layers and sacrificial layers. A sacrificial liner is formed over the nanosheet stack and a dielectric gate structure is formed over the nanosheet stack and the sacrificial liner. A first inner spacer is formed on a sidewall of the sacrificial layers. A gate is formed over channel regions of the nanosheet stack. The gate includes a conductive bridge that extends over the substrate in a direction orthogonal to the nanosheet stack. A second inner spacer is formed on a sidewall of the gate. The first inner spacer is formed prior to the gate stack, while the second inner spacer is formed after, and consequently, the gate stack is asymmetrical.

14 Claims, 25 Drawing Sheets

(51) Int. Cl.
*H01L 29/78* (2006.01)
*H01L 29/423* (2006.01)

(58) Field of Classification Search
CPC ..... H01L 21/823437; H01L 21/823475; H01L 27/088; H01L 29/4238; H01L 29/42392; H01L 29/66439; H01L 29/78696; H01L 29/775; H01L 29/0673; B82Y 10/00
See application file for complete search history.

(56) References Cited

U.S. PATENT DOCUMENTS

| | | | |
|---|---|---|---|
| 9,842,914 | B1 | 12/2017 | Yeung et al. |
| 9,923,055 | B1 | 3/2018 | Cheng et al. |
| 9,991,261 | B2 | 6/2018 | Mitard |
| 10,014,390 | B1 | 7/2018 | Bouche et al. |
| 10,134,859 | B1 | 11/2018 | Bi et al. |
| 10,170,584 | B2 | 1/2019 | Guillorn et al. |
| 10,229,983 | B1 | 3/2019 | Bu et al. |
| 10,243,061 | B1 | 3/2019 | Cheng et al. |
| 2016/0118480 | A1 | 4/2016 | Xie et al. |
| 2017/0040321 | A1 | 2/2017 | Mitard |
| 2017/0110595 | A1* | 4/2017 | Sengupta .......... H01L 29/78696 |
| 2018/0197785 | A1* | 7/2018 | Cheng .................... H01L 21/86 |
| 2018/0219082 | A1 | 8/2018 | Guillorn et al. |
| 2019/0326395 | A1 | 10/2019 | Ando et al. |
| 2019/0378915 | A1 | 12/2019 | Frougier et al. |
| 2020/0066894 | A1 | 2/2020 | Frougier et al. |
| 2020/0111798 | A1 | 4/2020 | Paul et al. |
| 2020/0152738 | A1 | 5/2020 | Kim et al. |

OTHER PUBLICATIONS

IBM "List of IBM Patents or Patent Applications Treated as Related; (Appendix P)", Filed Oct. 21, 2021, 2 pages.

International Search Report; International Application No. PCTIB2021053610; International Filing Date: Apr. 30, 2021; dated Aug. 12, 2021 ; 10 pages.

Weckx et al., "Stacked nanosheet fork architecture for SRAM design and device co-optimization toward 3nm," International Electron Devices Meeting (IEDM), 2017, 20.5, 4 pp.

Xie et al., "Nanosheet Transistor With Asymmetric Gate Stack," U.S. Appl. No. 16/876,443, filed May 18, 2020.

Ye et al., "The last silicon transistor: Nanosheet devices could be the final evolutionary step for Moore's Law," IEEE Spectrum, vol. 56, No. 8, 2019, pp. 30-35.

* cited by examiner

NANOSHEET TRANSISTOR WITH ASYMMETRIC GATE STACK

BACKGROUND

The present invention generally relates to fabrication methods and resulting structures for semiconductor devices, and more specifically, to an improved process and resulting structures for nanosheet transistors having asymmetric gate stacks.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs include a non-planar architecture that provides increased device density and some increased performance over lateral devices. In nanosheet FETs, in contrast to conventional planar FETs, the channel is implemented as a plurality of stacked and spaced apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL).

SUMMARY

Embodiments of the invention are directed to a method for forming a nanosheet device having asymmetric gate stacks. A non-limiting example of the method includes forming a nanosheet stack over a substrate. The nanosheet stack includes alternating semiconductor layers and sacrificial layers. A sacrificial liner is formed over the nanosheet stack and a dielectric gate structure is formed over the nanosheet stack and the sacrificial liner. A first inner spacer is formed on a sidewall of the sacrificial layers. The method includes forming a gate over channel regions of the nanosheet stack. The gate includes a conductive bridge that extends over the substrate in a direction orthogonal to the nanosheet stack. A second inner spacer is formed on a sidewall of the gate. The gate stack is asymmetrical.

Embodiments of the invention are directed to a semiconductor structure. A non-limiting example of the semiconductor structure includes a nanosheet stack over a substrate and a gate over channel regions of the nanosheet stack. The gate includes a conductive bridge that extends over the substrate in a direction orthogonal to the nanosheet stack. A dielectric gate structure is positioned over the nanosheet stack and the gate. A first inner spacer is positioned on a first end of the nanosheet stack and a second inner spacer is positioned on a second end of the nanosheet stack. The first inner spacer and the second inner spacer are formed during different portions of the workflow (one prior to the gate stack, and the other after) and, consequently, the gate stack is asymmetrical. A gate dielectric extends between the first inner spacer and the gate but not between the second inner spacer and the gate.

Embodiments of the invention are directed to a method for forming a nanosheet device having asymmetric gate stacks. A non-limiting example of the method includes forming a nanosheet stack over a substrate. The nanosheet stack includes alternating semiconductor layers and sacrificial layers. A spacer layer is formed over a sidewall of the nanosheet stack and a first dielectric gate structure is formed over the substrate and on a sidewall of the spacer layer. The method includes forming a sacrificial liner on the first dielectric gate structure and forming a second dielectric gate structure on the sacrificial liner. The sacrificial layers, spacer layer, and sacrificial liner are replaced with a gate. The gate includes a conductive bridge positioned between the first dielectric gate structure and the second dielectric gate structure.

Embodiments of the invention are directed to a semiconductor structure. A non-limiting example of the semiconductor structure includes a nanosheet stack over a substrate. A first dielectric gate structure is positioned on the substrate. A gate is over channel regions of the nanosheet stack. The gate includes a conductive bridge that extends over the substrate in a direction orthogonal to the nanosheet stack. The conductive bridge is positioned on a surface of the first dielectric gate structure. A second dielectric gate structure is positioned on the conductive bridge.

Embodiments of the invention are directed to a semiconductor structure. A non-limiting example of the semiconductor structure includes a first nanosheet stack over a substrate. A second nanosheet stack is positioned over the substrate and adjacent to the first nanosheet stack. The structure further includes a first dielectric gate structure on the substrate. The first dielectric gate structure is between the first nanosheet stack and the second nanosheet stack. The structure includes a gate having a first portion and a second portion. The first portion is over channel regions of the first nanosheet stack and the second portion is over channel regions of the second nanosheet stack. The gate includes a conductive bridge between the first portion and the second portion. The conductive bridge is positioned on a surface of the first dielectric gate structure. A second dielectric gate structure is on the conductive bridge.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
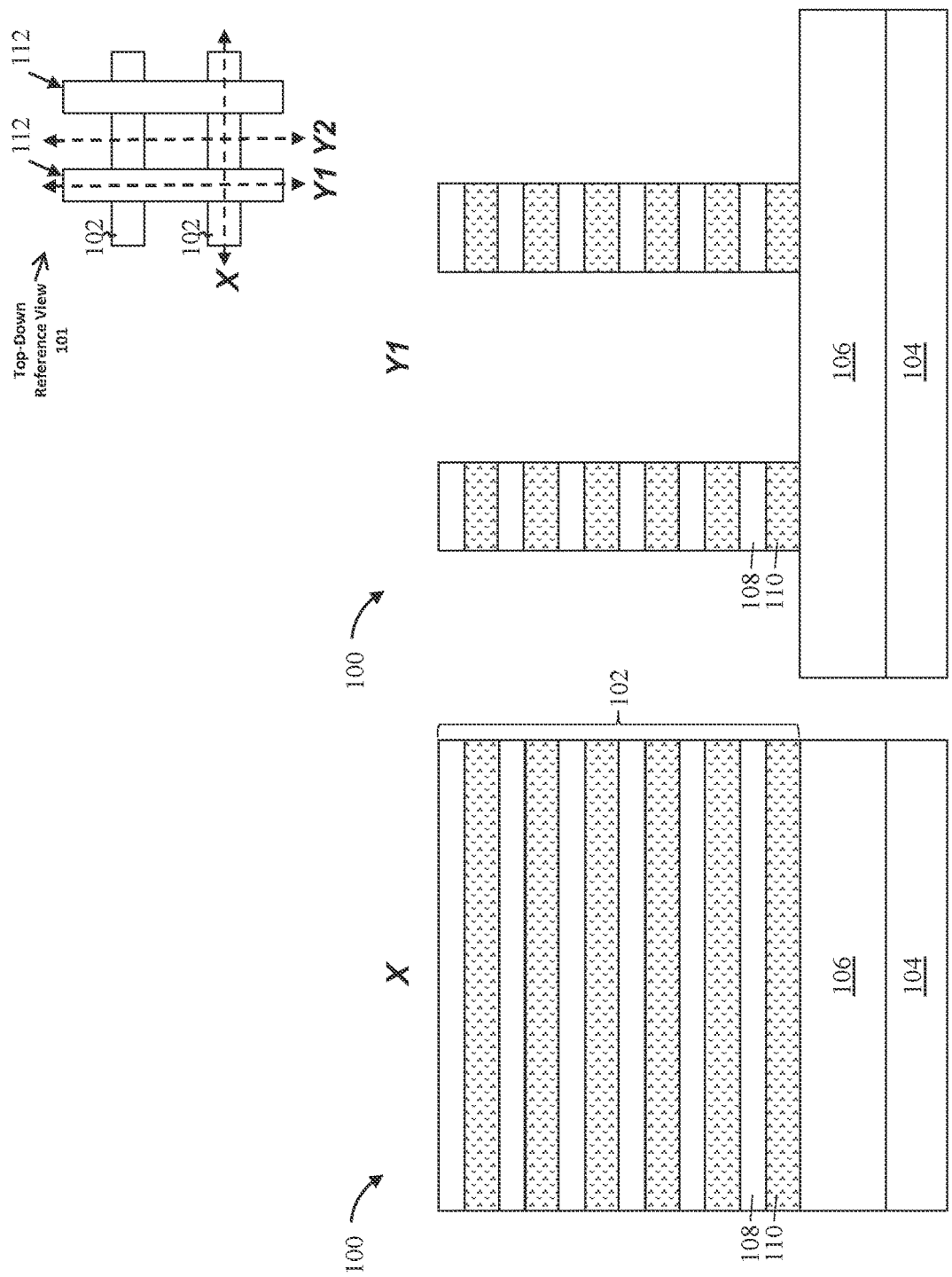
FIG. 1 depicts a top-down reference view, along with cross-sectional views of a semiconductor structure along the lines X and Y1 of the reference view after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, there are a few candidates for scaling nonplanar transistors beyond the 4 nm node, but each is currently limited due to various factors.

One candidate is the nanosheet transistor architecture. Nanosheets are able to maintain DC performance due to an adequate effective gate width, but AC performance is difficult because of the relatively large parasitic capacitance between the source/drain contact and gate. Cell height scaling difficulties are another issue, due to gate stack patterning challenges associated with tall nanosheet stacks. Tall nanosheet stacks are desirable, however, because they provide the same effective length at a smaller footprint, directly enabling area scaling.

Turning now to an overview of aspects of the present invention, one or more embodiments of the invention address the above-described shortcomings of known nanosheet architectures and fabrication techniques by providing a new nanosheet structure having asymmetric gate stacks and a method of fabricating the same that addresses the above-described difficulties with nanosheets, vertical transport field effect transistors (VTFETs), and complimentary field effect transistors (CFETs). In accordance with embodiments of the invention, this new nanosheet structure provides a high-k metal gate (HKMG) that wraps around stacked channels; a dielectric gate structure wraps around the HKMG; a conductive bridge connects shared gate devices; and an asymmetric high-k dielectric film is formed over the inner spacers.

A nanosheet structure formed in this manner offers several technical benefits. Effective gate width scaling is relatively easy and is already possible for the 3 nm, 2 nm, and 1 nm nodes. The dielectric gate structure offers improved mechanical stability for the HKMG, allowing the number of nanosheets in the stack to increase without introducing stability issues. Increasing the number of nanosheets directly increases the effective gate width. Capacitance is as good as VTFETs (similarly, only capacitance between gate and source/drain epitaxy is appreciable, with minimum capacitance between gate-to-silicide or gate-to-contact), as the amount of gate metal is minimal, with no waste of gate metal that could be an additional source of parasitic gate to source/drain capacitance. Cell size scaling is better than either nanosheet or VTFET, and is readily scalable to 3 nm, 2 nm, and 1 nm nodes. Process complexity is much easier than VTFETs and CFETs. Process control is much better than VTFET or CFETs.

Turning now to a more detailed description of fabrication operations and resulting structures according to aspects of the invention, FIGS. 1-11 depict a semiconductor structure 100 after various fabrication operations in accordance with aspects of the invention. Although the cross-sectional diagrams depicted in FIGS. 1-11 are two-dimensional, it is understood that the diagrams depicted in FIGS. 1-11 represent three-dimensional structures. The top-down reference view 101 shown in FIG. 1 provides a reference point for the various cross-sectional views: X-view (across gate in channel region), Y1-view (along gates in channel region), and Y2-view (along gates in source/drain region) shown in FIGS. 1-11.

FIG. 1 depicts cross-sectional views of the semiconductor structure 100 taken along the lines X and Y1 of the reference view 101 after an initial set of fabrication operations have been applied as part of a method of fabricating a final semiconductor device according to one or more embodiments of the invention. In some embodiments of the invention, one or more nanosheet stacks 102 are formed over a substrate 104.

The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 can include a buried oxide layer 106 in a silicon-on-insulator (SOI) configuration. The buried oxide layer 106 can be made of any suitable dielectric material, such as, for example, a silicon oxide. In some embodiments of the invention, the buried oxide layer 106 is formed to a thickness of about 10-200 nm, although other thicknesses are within the contemplated scope of the invention. In some embodiments of the invention, the semiconductor structure 100 can also be formed without the buried oxide layer 106. In that case, an STI (shallow trench isolation) will be formed to isolate device from device.

In some embodiments of the invention, the nanosheet stacks 102 can include one or more semiconductor layers 108 alternating with one or more sacrificial layers 110. In some embodiments of the invention, the semiconductor layers 108 and the sacrificial layers 110 are epitaxially grown layers. For ease of discussion reference is made to operations performed on and to a nanosheet stack having six nanosheets (e.g., the six semiconductor layers 108 shown in FIG. 1) alternating with six sacrificial layers (e.g., the six sacrificial layers 110). It is understood, however, that the nanosheet stacks 102 can include any number of nanosheets alternating with a corresponding number of sacrificial layers. For example, the nanosheet stacks 102 can include two nanosheets, five nanosheets, eight nanosheets, 30 nanosheets (e.g., 3D NAND), or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 108 can be made of any suitable material such as, for example, monocrystalline silicon or silicon germanium. In some embodiments of the invention, the semiconductor layers 108 are silicon nanosheets. In some embodiments of the invention, the semiconductor layers 108 have a thickness of about 4 nm to about 10 nm, for example 6 nm, although other thicknesses are within the contemplated scope of the invention. In some embodiments of the invention, the substrate 104 and the semiconductor layers 108 can be made of a same semiconductor material. In other embodiments of the invention, the substrate 104 can be made of a first semiconductor material, and the semiconductor layers 108 can be made of a second semiconductor material.

The sacrificial layers 110 can be silicon or silicon germanium layers, depending on the material of the semiconductor layers 108 to meet etch selectivity requirements. For example, in embodiments where the semiconductor layers 108 are silicon nanosheets, the sacrificial layers 110 can be silicon germanium layers. In embodiments where the semiconductor layers 108 are silicon germanium nanosheets, the sacrificial layers 110 can be silicon germanium layers having a germanium concentration that is greater than the germanium concentration in the semiconductor layers 108. For example, if the semiconductor layers 108 are silicon germanium having a germanium concentration of 5 percent (sometimes referred to as SiGe5), the sacrificial layers 110 can be silicon germanium layers having a germanium concentration of about 25 (SiGe25), although other germanium concentrations are within the contemplated scope of the invention. In some embodiments of the invention, the sacrificial layers 110 have a thickness of about 8 nm to about 15 nm, for example 10 nm, although other thicknesses are within the contemplated scope of the invention.

As shown in the cross-sectional view Y1, portions of the nanosheet stacks 102 can be removed (exposing a surface of the buried oxide layer 106) to define the nanosheet stack width. In some embodiments of the invention, the width of the nanosheet stacks 102 is about 10-100 nm, although other widths are within the contemplated scope of the invention.

Figure 2:
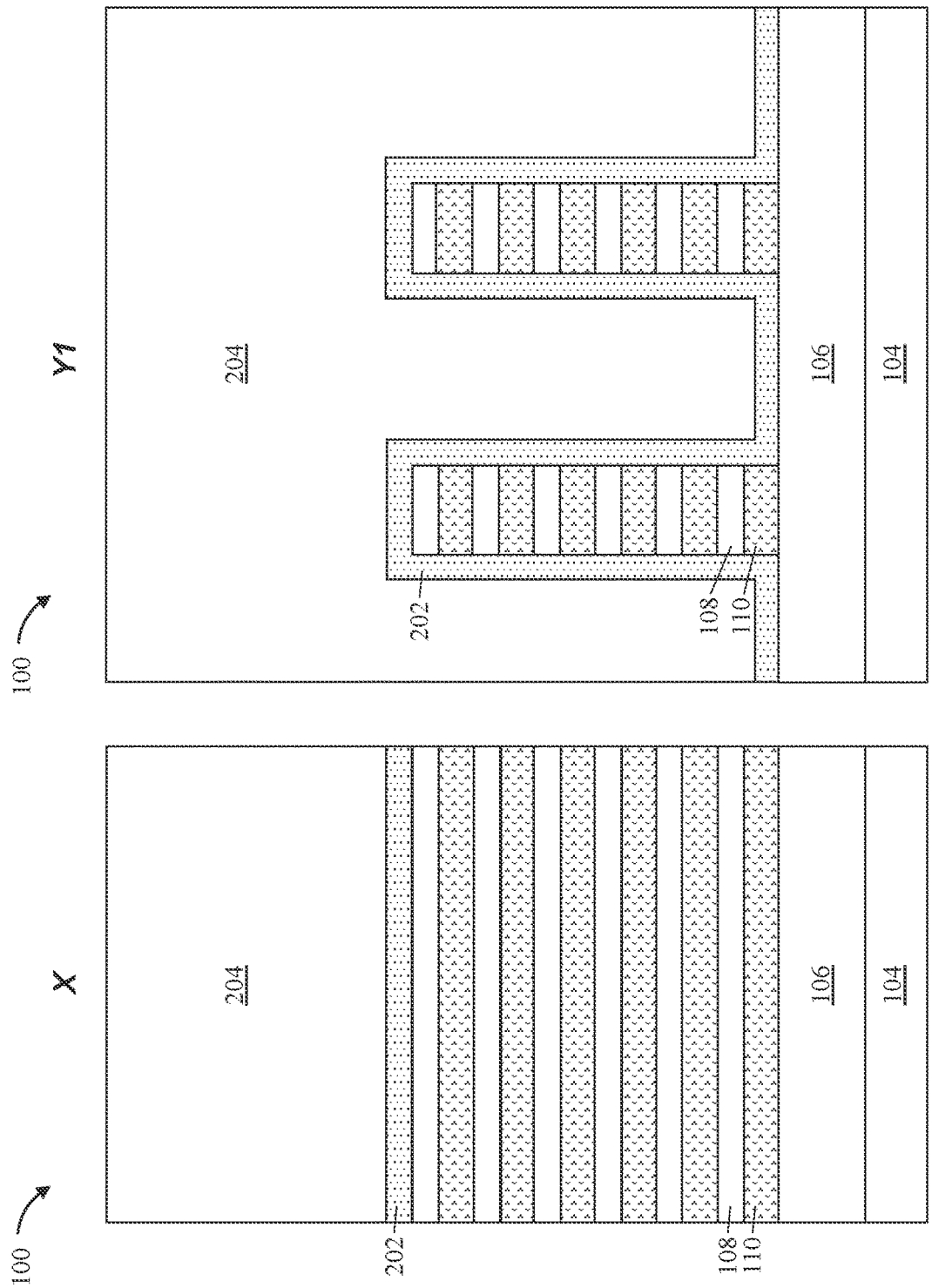
FIG. 2 depicts cross-sectional views of a semiconductor structure along the lines X and Y1 of the reference view according to one or more embodiments of the invention.

FIG. 2 depicts cross-sectional views of the semiconductor structure 100 taken along the lines X and Y1 of the reference view 101 after a processing operation according to one or more embodiments of the invention. In some embodiments of the invention, a sacrificial liner 202 is formed over the nanosheet stacks 102 and the buried oxide layer 106. In some embodiments of the invention, the sacrificial liner 202 is conformally deposited over the nanosheet stacks 102. In some embodiments of the invention, the sacrificial liner 202 has a thickness greater than the sacrificial layers 110, for example, of about 20 nm to about 60 nm, although other thicknesses are within the contemplated scope of the invention.

In some embodiments of the invention, the sacrificial liner 202 is formed using chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. The sacrificial liner 202 can be made of any suitable sacrificial material, for example, for example, silicon germanium (SiGe), although other sacrificial materials are within the contemplated scope of the invention.

As shown in the cross-sectional view Y1, a dielectric gate structure 204 is formed over the sacrificial liner 202. The dielectric gate structure 204 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3.0), porous silicates, carbon doped oxides, silicon dioxides, silicon nitrides, silicon oxynitrides, silicon carbide (SiC), or other dielectric materials. Any known manner of forming the dielectric gate structure 204 can be utilized, such as, for example, CVD, PECVD, ALD, flowable CVD, spin-on dielectrics, or PVD. In some embodiments of the invention, the semiconductor structure 100 is planarized, using, for example, a chemical-mechanical planarization (CMP) process.

Figure 3:
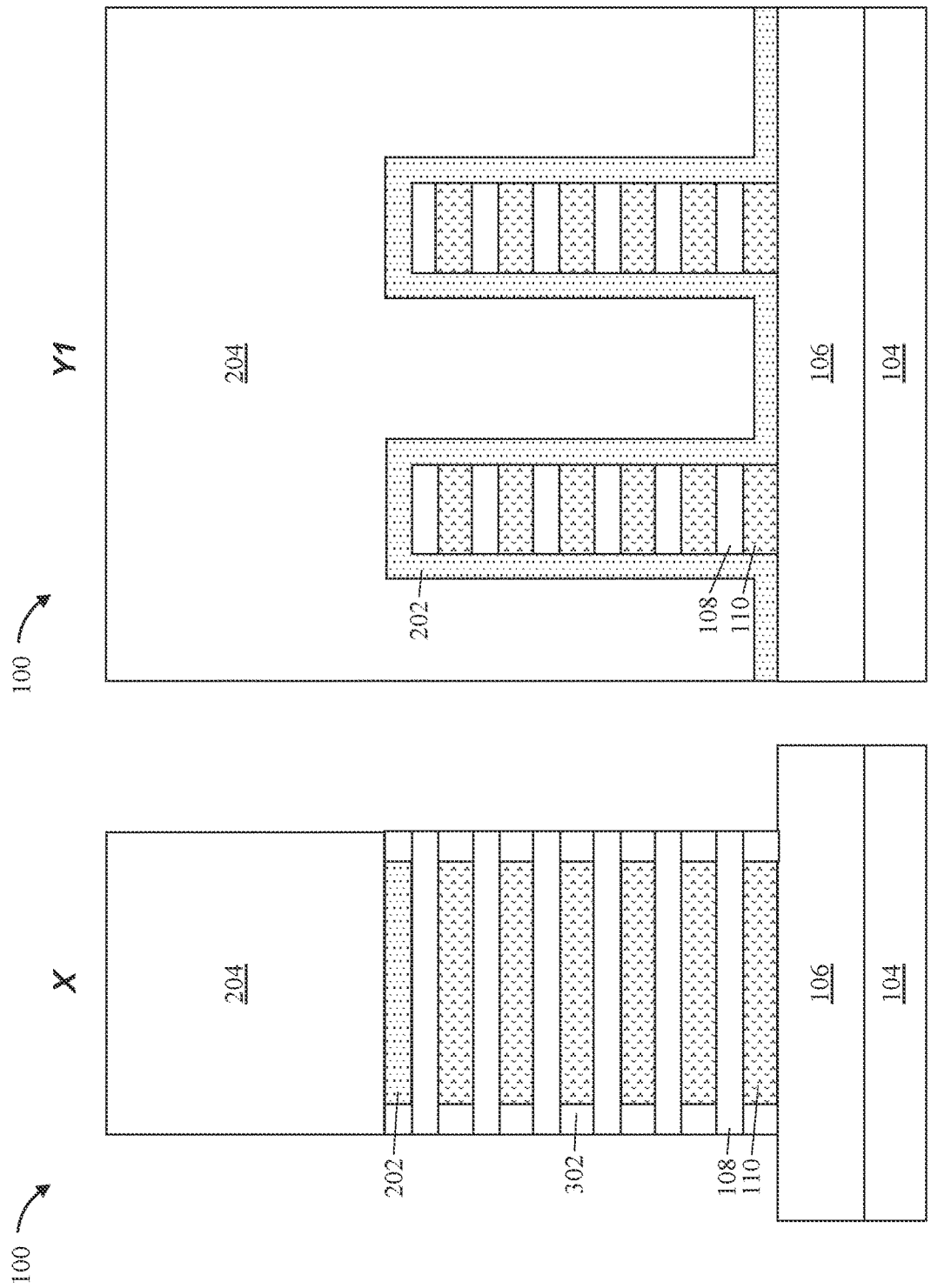
FIG. 3 depicts cross-sectional views of a semiconductor structure along the lines X and Y1 of the reference view according to one or more embodiments of the invention.

FIG. 3 depicts cross-sectional views of the semiconductor structure 100 taken along the lines X and Y1 of the reference view 101 after a processing operation according to one or more embodiments of the invention. In some embodiments of the invention, the nanosheet stacks 102, the dielectric gate structure 204, and the sacrificial liner 202 are patterned to expose a surface of the buried oxide layer 106. The nanosheet stacks 102, the dielectric gate structure 204, and the sacrificial liner 202 can be patterned using, for example, a wet etch, a dry etch, or a combination of wet and/or dry etches. In some embodiments of the invention, the nanosheet stacks 102 are patterned using a RIE.

In some embodiments of the invention, the sacrificial layers 110 can be recessed and inner spacers 302 can be formed on the recessed sidewalls of the sacrificial layers 110. For example, sidewalls of the sacrificial layers 110 can be recessed to form cavities (not shown) in the nanosheet stacks 102. In some embodiments of the invention, the inner spacers 302 are formed on recessed sidewalls of the sacrificial layers 110 by filling these cavities with dielectric material. In some embodiments of the invention, portions of the inner spacers 302 that extend beyond sidewalls of the nanosheet stack 102 are removed, using, for example, by an isotropic etching process. In this manner, sidewalls of the inner spacers 302 are coplanar to sidewalls of the semiconductor layers 108. In some embodiments of the invention, the inner spacers 302 are formed using a CVD, PECVD, ALD, PVD, chemical solution deposition, or other like processes in combination with a wet or dry etch process. The inner spacers 302 can be made of any suitable material, such as, for example, a low-k dielectric, a nitride, silicon nitride, silicon dioxide, SiON, SiC, SiOCN, or SiBCN.

Figure 4:
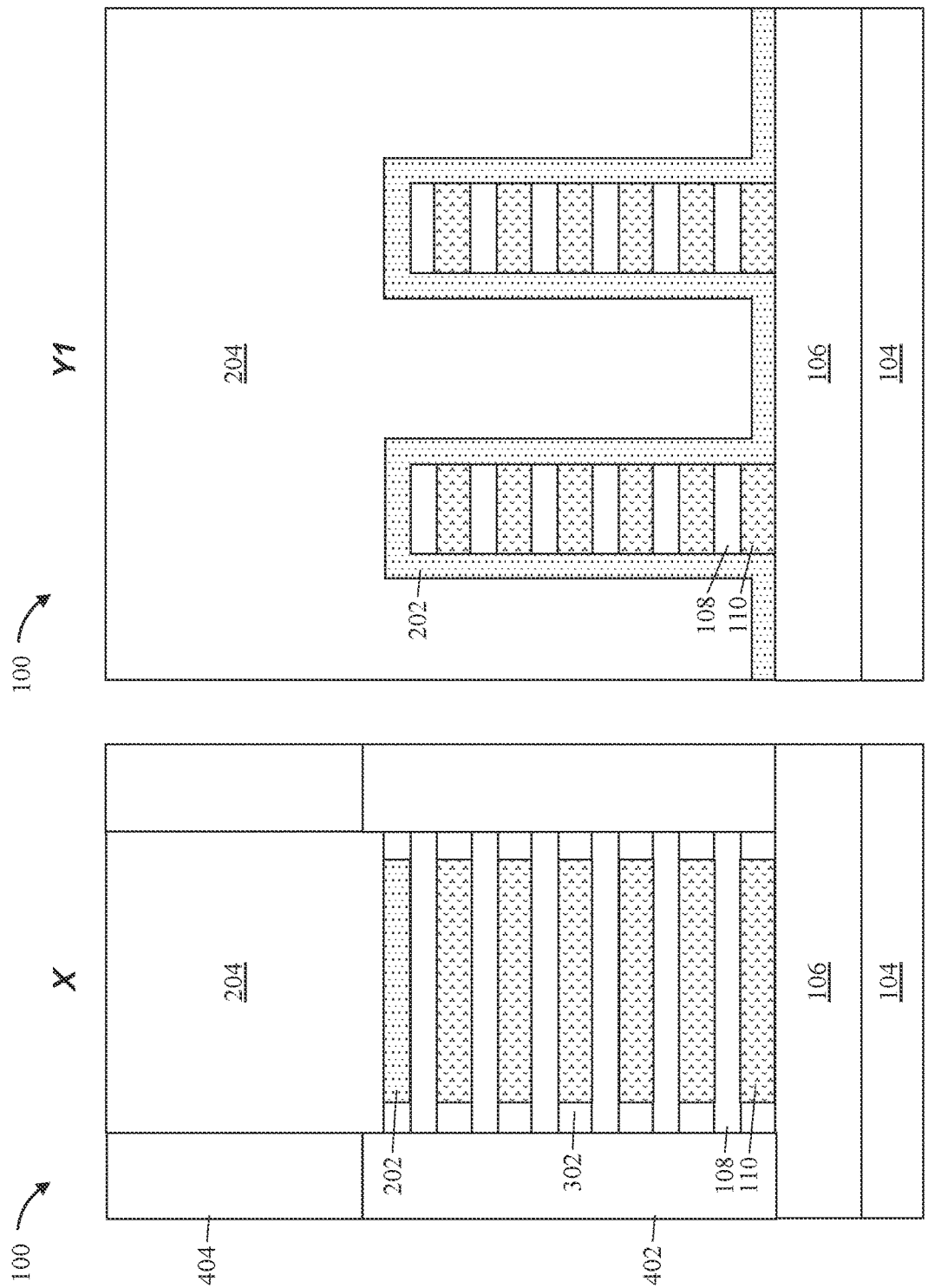
FIG. 4 depicts cross-sectional views of a semiconductor structure along the lines X and Y1 of the reference view according to one or more embodiments of the invention.

FIG. 4 depicts cross-sectional views of the semiconductor structure 100 taken along the lines X and Y1 of the reference view 101 after a processing operation according to one or more embodiments of the invention. In some embodiments of the invention, source and drain regions 402 are formed on exposed sidewalls of the semiconductor layers 108. The source and drain regions 402 can be epitaxially grown using, for example, vapor-phase epitaxy (VPE), molecular beam epitaxy (MBE), liquid-phase epitaxy (LPE), or other suitable processes. The source and drain regions 402 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 402 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the source and drain regions 402 are made of silicon or silicon germanium. In some embodiments of the invention, the source and drain regions 402 are made of silicon germanium doped with boron to a boron concentration of about 1 to about 15 percent, for example, 2 percent, although other boron concentrations are within the contemplated scope of the invention.

In some embodiments of the invention, an interlayer dielectric (ILD) 404 is formed over the source and drain regions 402. The ILD 404 can be made of any suitable dielectric material, such as, for example, oxides, a low-k dielectric, nitrides, silicon nitride, silicon oxide, SiON, SiC, SiOCN, and SiBCN. In some embodiments of the invention, the ILD 404 is deposited over the semiconductor structure 100 and the semiconductor structure 100 is then planarized using, for example, CMP.

Figure 5:
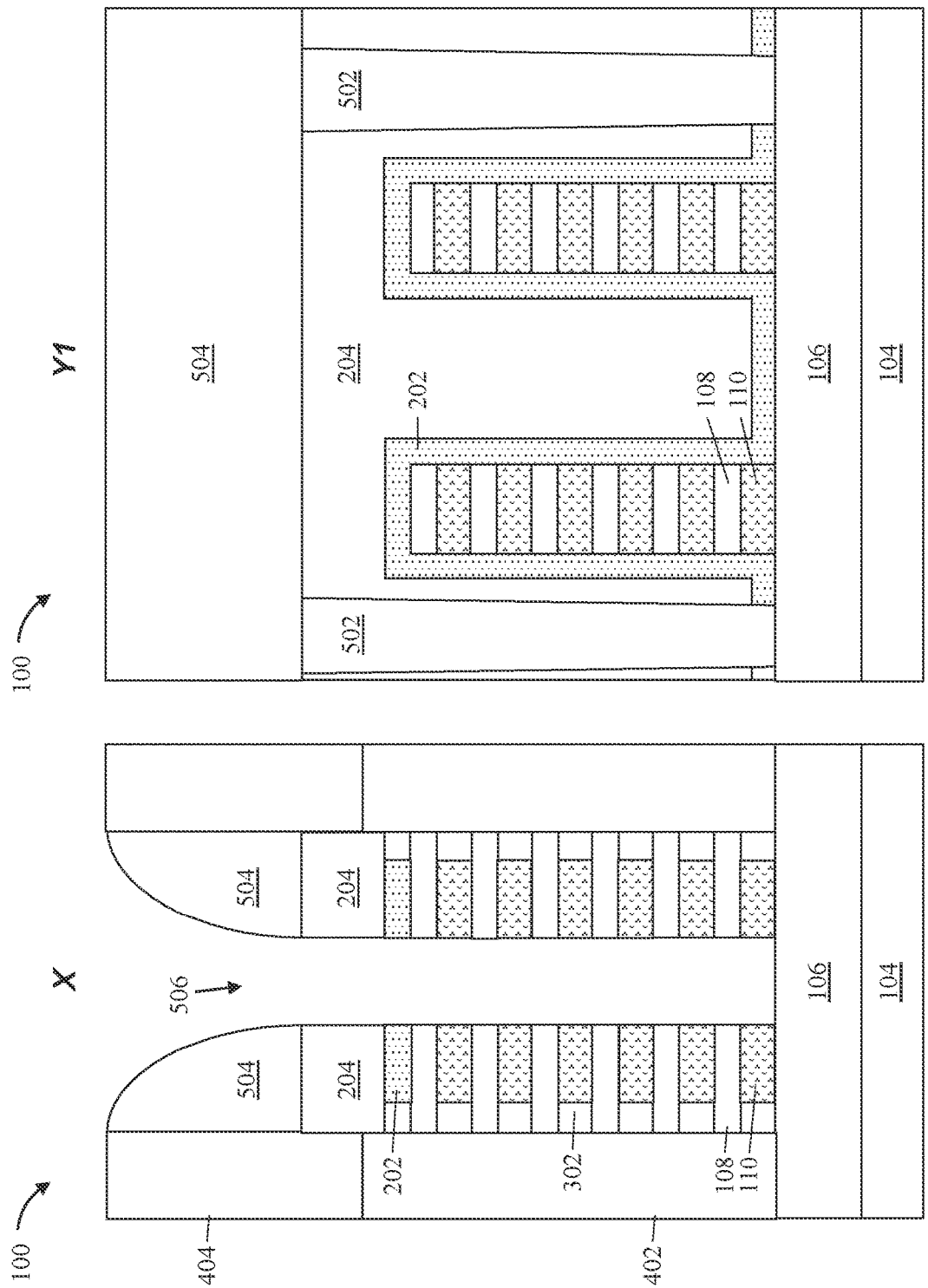
FIG. 5 depicts cross-sectional views of a semiconductor structure along the lines X and Y1 of the reference view according to one or more embodiments of the invention.

FIG. 5 depicts cross-sectional views of the semiconductor structure 100 taken along the lines X and Y1 of the reference view 101 after a processing operation according to one or more embodiments of the invention. In some embodiments of the invention, a gate cut 502 is formed by removing portions of the dielectric gate structure 204 and sacrificial liner 202 to define a trench (not shown) exposing a surface of the buried oxide layer 106. The trench is then filled with a dielectric material, such as, for example, a low-k dielectric, nitrides, silicon nitride, silicon oxide, SiON, SiC, SiOCN, and SiBCN.

In some embodiments of the invention, the dielectric gate structure 204 is recessed to expose sidewalls of the ILD 404. In some embodiments of the invention, a spacer layer 504 is formed on the recessed surface of the dielectric gate structure 204. The spacer layer 504 can be made of any suitable dielectric material, such as, for example, a low-k dielectric, nitrides, silicon nitride, silicon oxide, SiON, SiC, SiOCN, and SiBCN. In some embodiments of the invention, the spacer layer 504 is a conformal layer deposited over the semiconductor structure 100 followed by an anisotropic etch. The width of the spacer layer 504 will later define the gate length of the transistors.

As further shown in FIG. 5, portions of the sacrificial liner 202, the semiconductor layers 108, the sacrificial layers 110, and the dielectric gate structure 204 can be removed (sometimes referred to as a stack recess) to define a gate patterning trench 506 that exposes a surface of the buried oxide layer 106. Patterning can be accomplished using, for example, a wet etch, a dry etch, or a combination of wet and/or dry etches. In some embodiments of the invention, the semiconductor structure 100 is patterned using a RIE.

Figure 6:
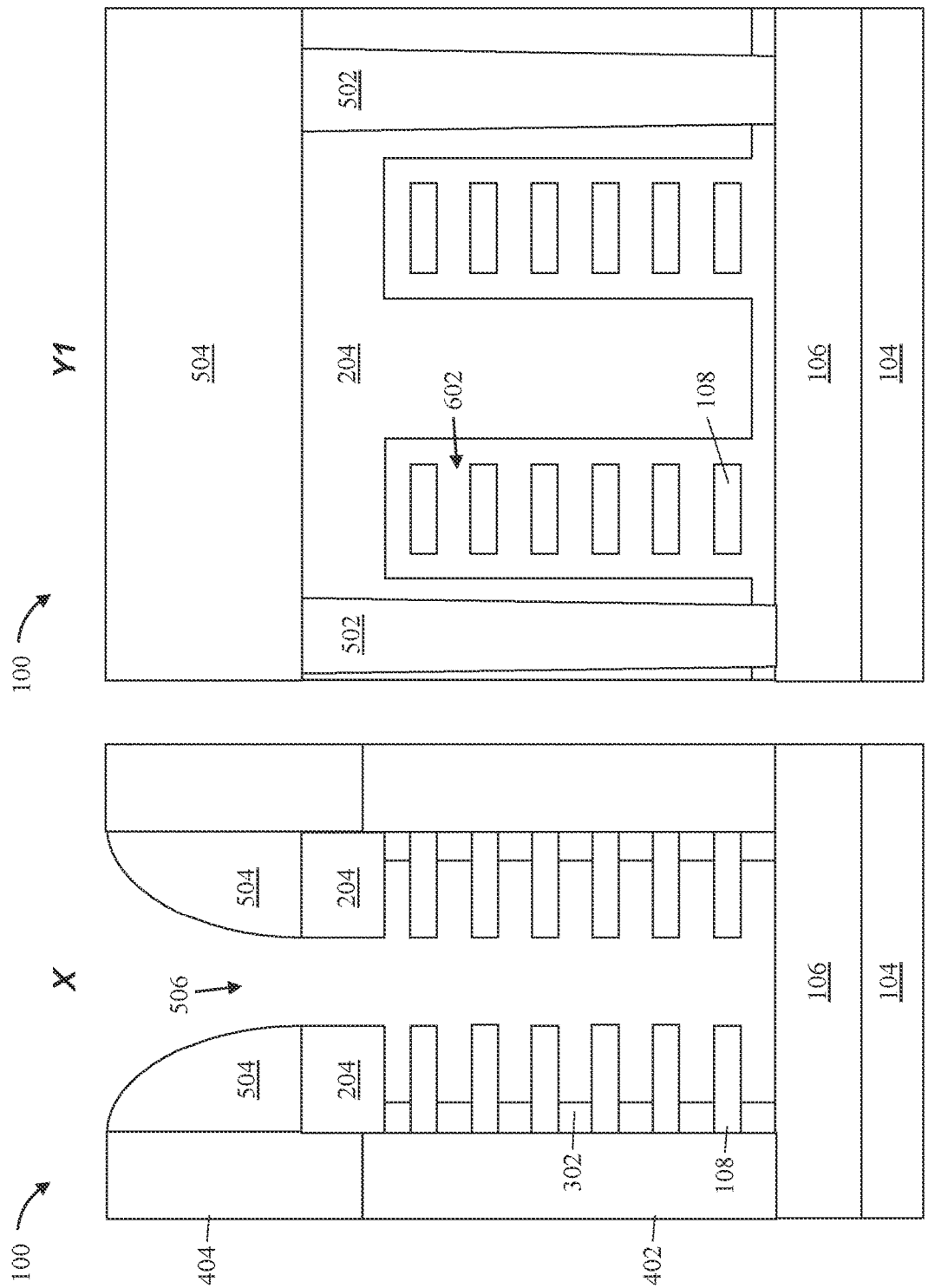
FIG. 6 depicts cross-sectional views of a semiconductor structure along the lines X and Y1 of the reference view according to one or more embodiments of the invention.

FIG. 6 depicts cross-sectional views of the semiconductor structure 100 taken along the lines X and Y1 of the reference view 101 after a processing operation according to one or more embodiments of the invention. In some embodiments of the invention, the sacrificial liner 202 and the sacrificial layers 110 can be removed to form a cavity 602 that releases the semiconductor layers 108 (once released, the semiconductor layers 108 are often referred to as nanosheets). The sacrificial liner 202 and the sacrificial layers 110 can be removed selective to the semiconductor layers 108. For example, when the semiconductor layers 108 are formed of silicon and the sacrificial liner 202 and the sacrificial layers 110 are formed of SiGe, carboxylic acid/nitric acid/HF chemistry, citric acid/nitric acid/HF, and vapor phased HCl, for example, can be utilized to remove SiGe selective to silicon. In another example, when the semiconductor layers 108 are formed of SiGe and the sacrificial liner 202 and the sacrificial layers 110 are formed of silicon, aqueous hydroxide chemistry, including ammonium hydroxide and potassium hydroxide, for example, can be utilized to remove silicon selective to SiGe.

Figure 7:
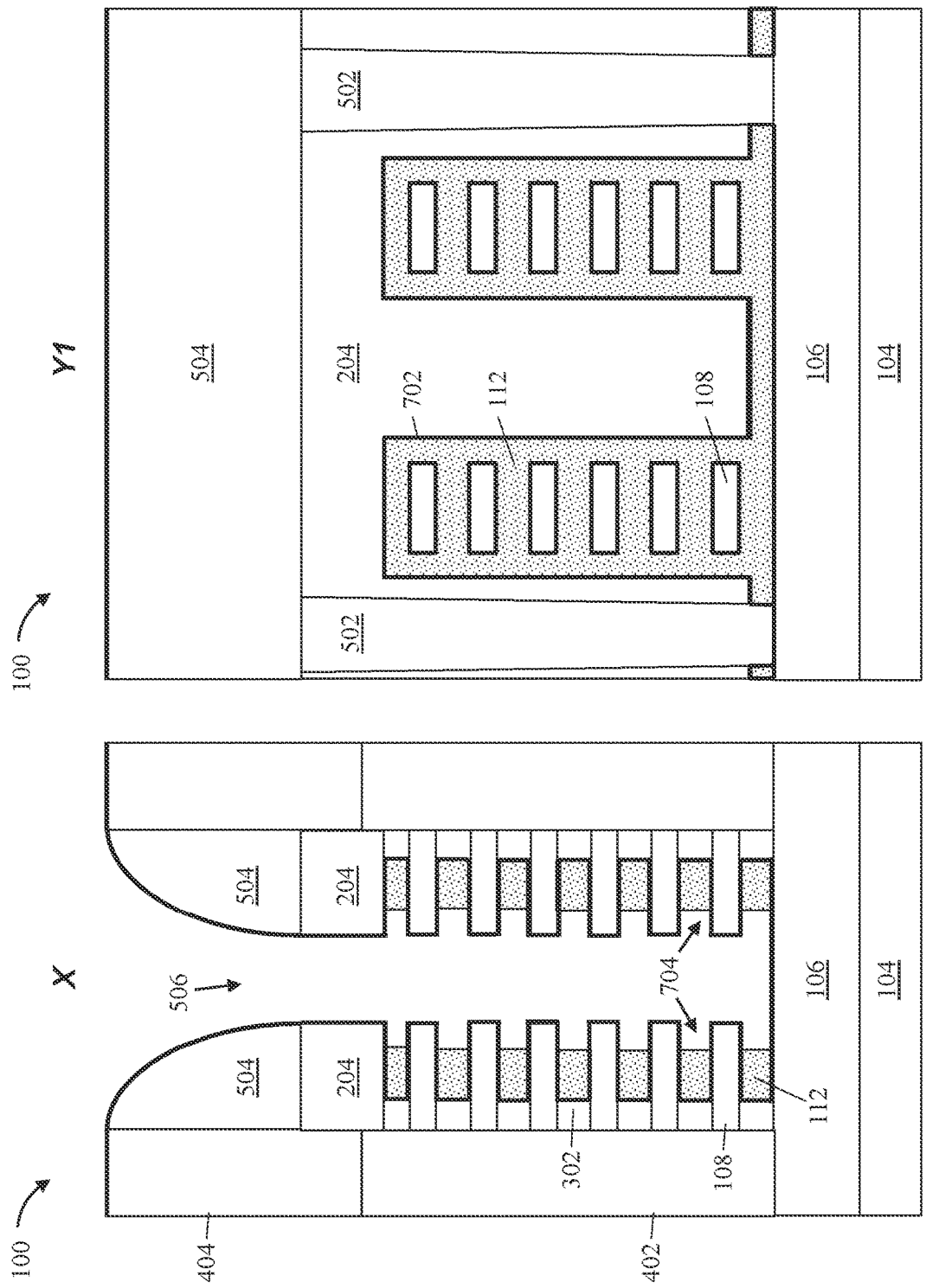
FIG. 7 depicts cross-sectional views of a semiconductor structure along the lines X and Y1 of the reference view according to one or more embodiments of the invention.

FIG. 7 depicts cross-sectional views of the semiconductor structure 100 taken along the lines X and Y1 of the reference view 101 after a processing operation according to one or more embodiments of the invention. In some embodiments of the invention, gates 112 (first depicted in the top-down reference view 101 in FIG. 1) are formed in the cavity 602.

The gates 112 can be high-k metal gates (HKMGs) formed over a channel region of the nanosheet stacks 102. The gates 112 can be referred to as metal gates or conductive gates. As used herein, the "channel region" refers to the portion of the semiconductor layers 108 over which the gates 112 are formed, and through which a current passes from source to drain in the final device. In some embodiments of the invention, the gates 112 are formed by depositing high-k/metal gate materials into the cavity 602 (shown in FIG. 6).

In some embodiments of the invention, the gates 112 can include a gate dielectric 702 and a work function metal stack (not separately depicted). In some embodiments, the gates 112 include a main body formed from bulk conductive gate material(s).

In some embodiments of the invention, the gate dielectric 702 is a high-k dielectric film formed on exposed surfaces of the semiconductor structure 100. In some embodiments of the invention, the high-k dielectric film is conformally deposited over the semiconductor structure 100. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention. In some embodiments of the invention, the semiconductor structure 100 undergoes a reliability anneal after depositing the gate dielectric 702.

In some embodiments of the invention, the gates 112 include one or more work function layers (sometimes referred to as a work function metal stack) formed on the gate dielectric 702 (positioned between the bulk gate material if present). In some embodiments of the invention, the gates 112 include one or more work function layers, but do not include a bulk gate material. If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 112 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiAl stack.

In some embodiments, the gates 112 include a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As further depicted in FIG. 7, the work function layers and the main body of the gates 112 can be recessed to define inner spacer cavities 704. In some embodiments of the invention, the inner spacer cavities 704 are formed by laterally etching the work function layers and/or the main body of the gates 112 selective to the gate dielectric 702.

Figure 8:
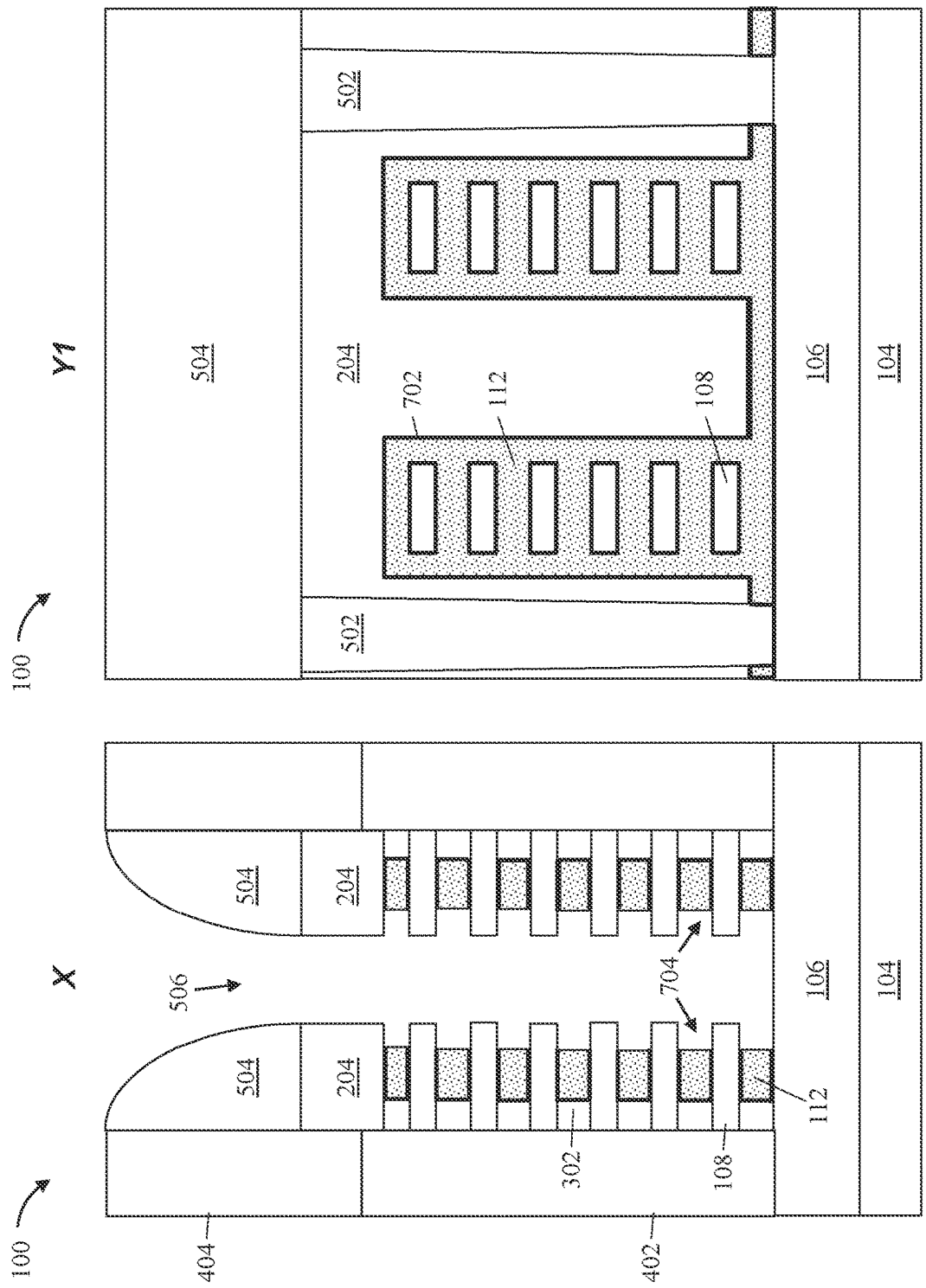
FIG. 8 depicts cross-sectional views of a semiconductor structure along the lines X and Y1 of the reference view according to one or more embodiments of the invention.

FIG. 8 depicts cross-sectional views of the semiconductor structure 100 taken along the lines X and Y1 of the reference view 101 after a processing operation according to one or more embodiments of the invention. In some embodiments of the invention, exposed portions of the gate dielectric 702 are removed to expose portions of the semiconductor layers 108, as well as surfaces of the buried oxide layer 106 and the dielectric gate structure 204. The gate dielectric 702 can be removed using any suitable process, such as, for example, a wet etch, a dry etch, or a combination of wet and/or dry etches. In some embodiments of the invention, the gate dielectric 702 is removed selective to the semiconductor layers 108.

Figure 9:
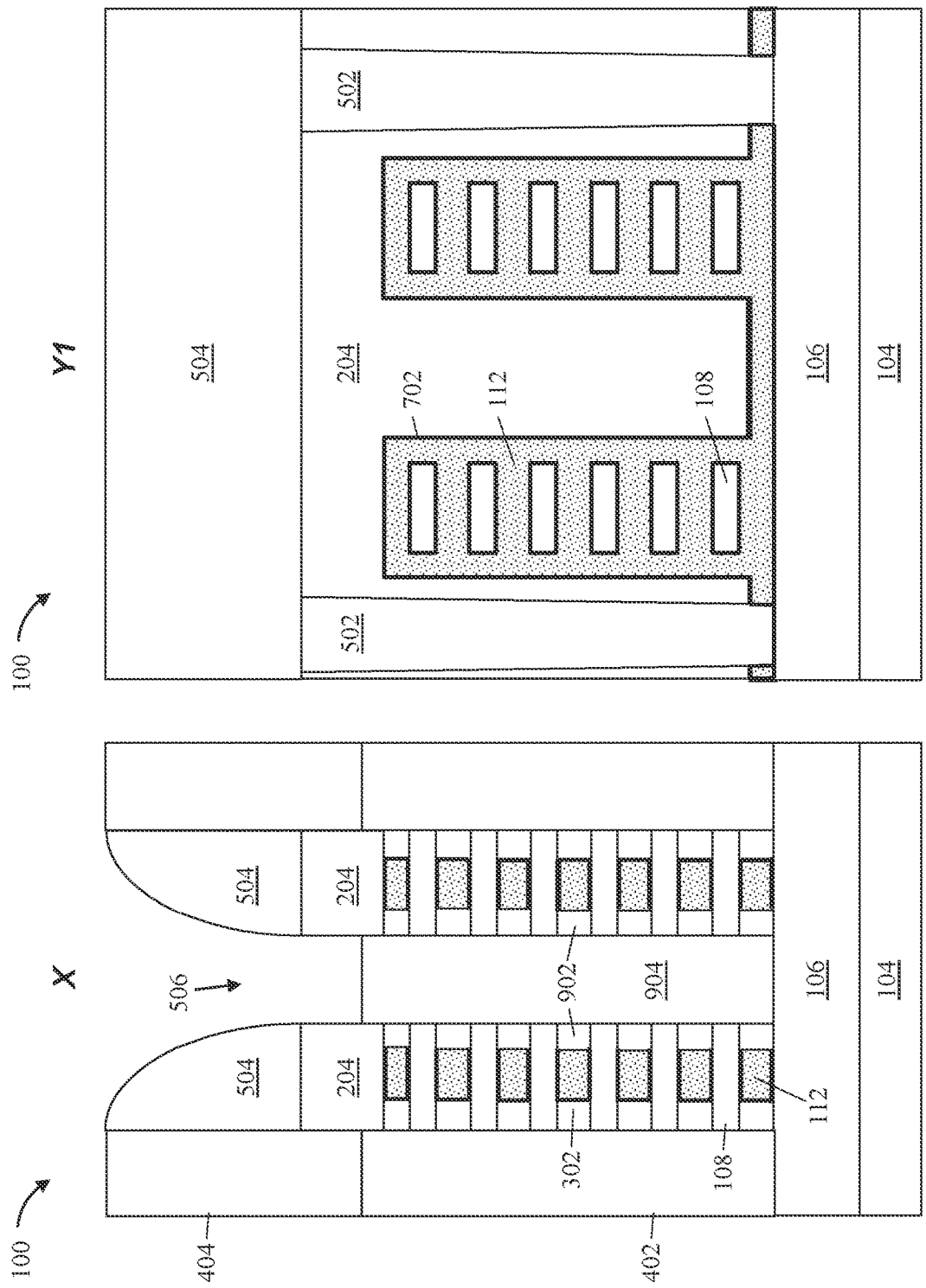
FIG. 9 depicts cross-sectional views of a semiconductor structure along the lines X and Y1 of the reference view according to one or more embodiments of the invention.

FIG. 9 depicts cross-sectional views of the semiconductor structure 100 taken along the lines X and Y1 of the reference view 101 after a processing operation according to one or more embodiments of the invention. In some embodiments of the invention, the inner spacer cavities 704 are filled with dielectric material to define inner spacers 902. The inner spacers 902 can be formed of a similar material and in a similar manner as the inner spacers 302. In some embodiments of the invention, a source and drain region 904 is formed adjacent to the inner spacers 902. The source and drain region 904 can be formed of a similar material and in a similar manner as the source and drain regions 402.

As shown in FIG. 9, the inner spacers 902 are formed separately from the inner spacers 302 (as depicted in FIG. 3). In particular, the width of the inner spacers 902 is defined by the recess depth of the work function layers and the main body of the gates 112 (when defining the inner spacer cavities 702), while the width of the inner spacers 302 is defined by the recess depth of the sacrificial layers 110 (when defining cavities for the inner spacers 302). It is noted that the gate dielectric 702 is deposited over the inner spacers 302 because the inner spacers 302 are formed before the gate dielectric 702 deposition and are exposed during the deposition (see FIG. 7). However, the gate dielectric 702 is not formed over the inner spacers 902 because the inner spacers 902 are formed after the high-k/metal gate recess (see FIG. 8). Consequently, the shape of the replacement gate stack 112 (combination of gate dielectric 702 and work function metal) is asymmetric.

Figure 10:
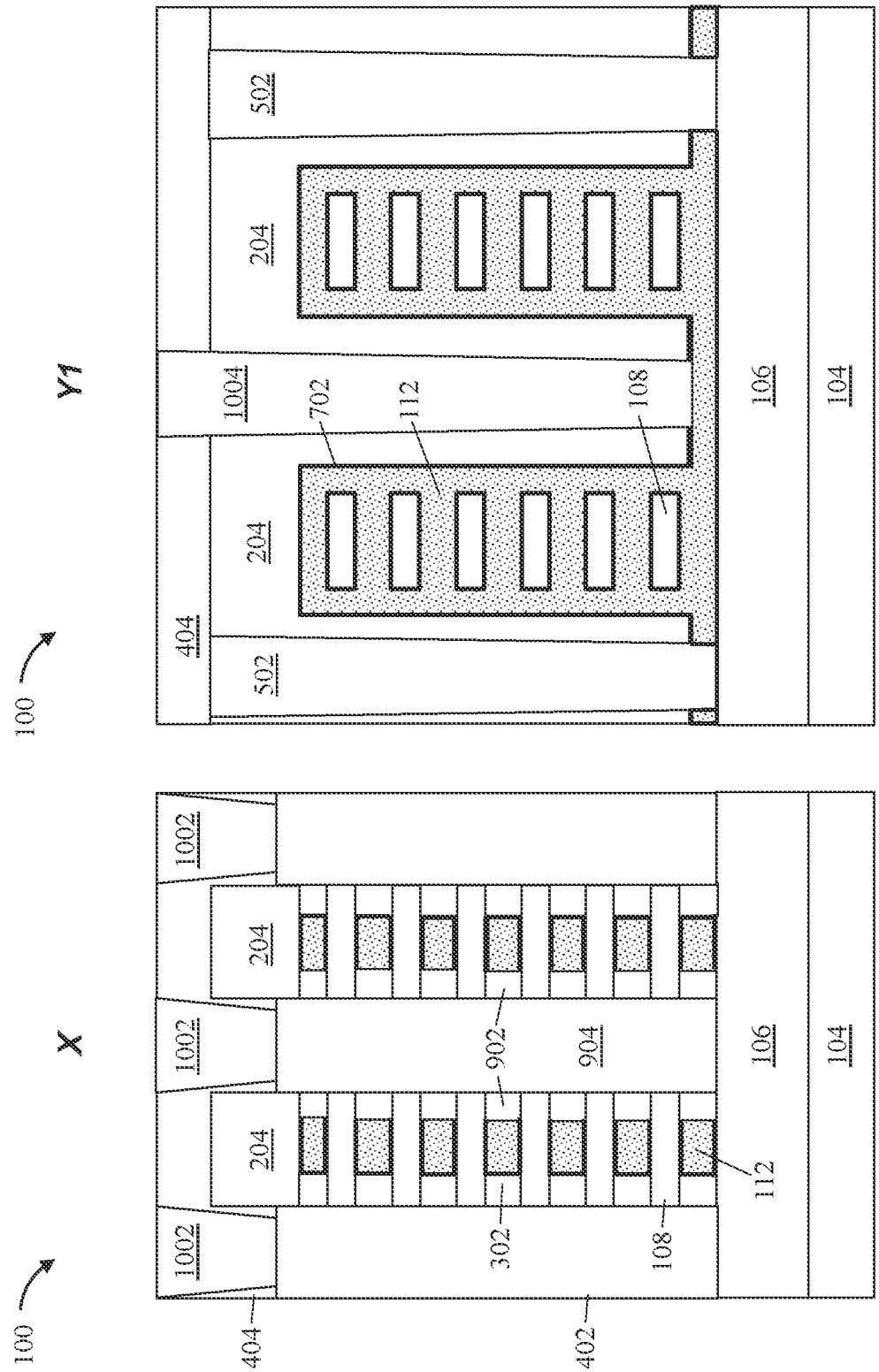
FIG. 10 depicts cross-sectional views of a semiconductor structure along the lines X and Y1 of the reference view according to one or more embodiments of the invention.

FIG. 10 depicts cross-sectional views of the semiconductor structure 100 taken along the lines X and Y1 of the reference view 101 after a processing operation according to one or more embodiments of the invention. In some embodiments of the invention, the spacer 504 can be removed, followed by additional ILD deposition and planarization, shown in FIG. 10 with extended ILD 404.

In some embodiments of the invention, portions of the isolation dielectric 404 and the dielectric gate structure 204 are removed (patterned) to form source/drain contact trenches (not shown) and a gate contact trench (not shown). In some embodiments of the invention, the source/drain contact trenches expose a surface of the source and drain regions 402 and 904 and the gate contact trench exposes a surface of the gates 112. The isolation dielectric 404 and the dielectric gate structure 204 can be patterned using a wet etch, a dry etch, or a combination of sequential wet and/or dry etches.

In some embodiments of the invention, source/drain contacts 1002 are formed in or deposited into the source/drain contact trenches and a gate contact 1004 is formed in or deposited into the gate trench. The source/drain contacts 1002 and the gate contact 1004 can be formed from materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the source/drain contacts 1002 and the gate contact 1004 are formed a same conductive material, for example, cobalt, copper, ruthenium, or tungsten. In some embodiments of the invention, the source/drain contacts 1002 and the gate contact 1004 are made of different conductive materials. For example, the source/drain contacts 1002 can be made cobalt or ruthenium and the gate contact 1004 can be made of copper, or vice versa. In some embodiments of the invention, the source/drain contacts 1002 and the gate contact 1004 each include a barrier liner (sometimes referred to as a metal liner, or barrier metal liner) to prevent diffusion into surrounding dielectrics (not shown).

Figure 11:
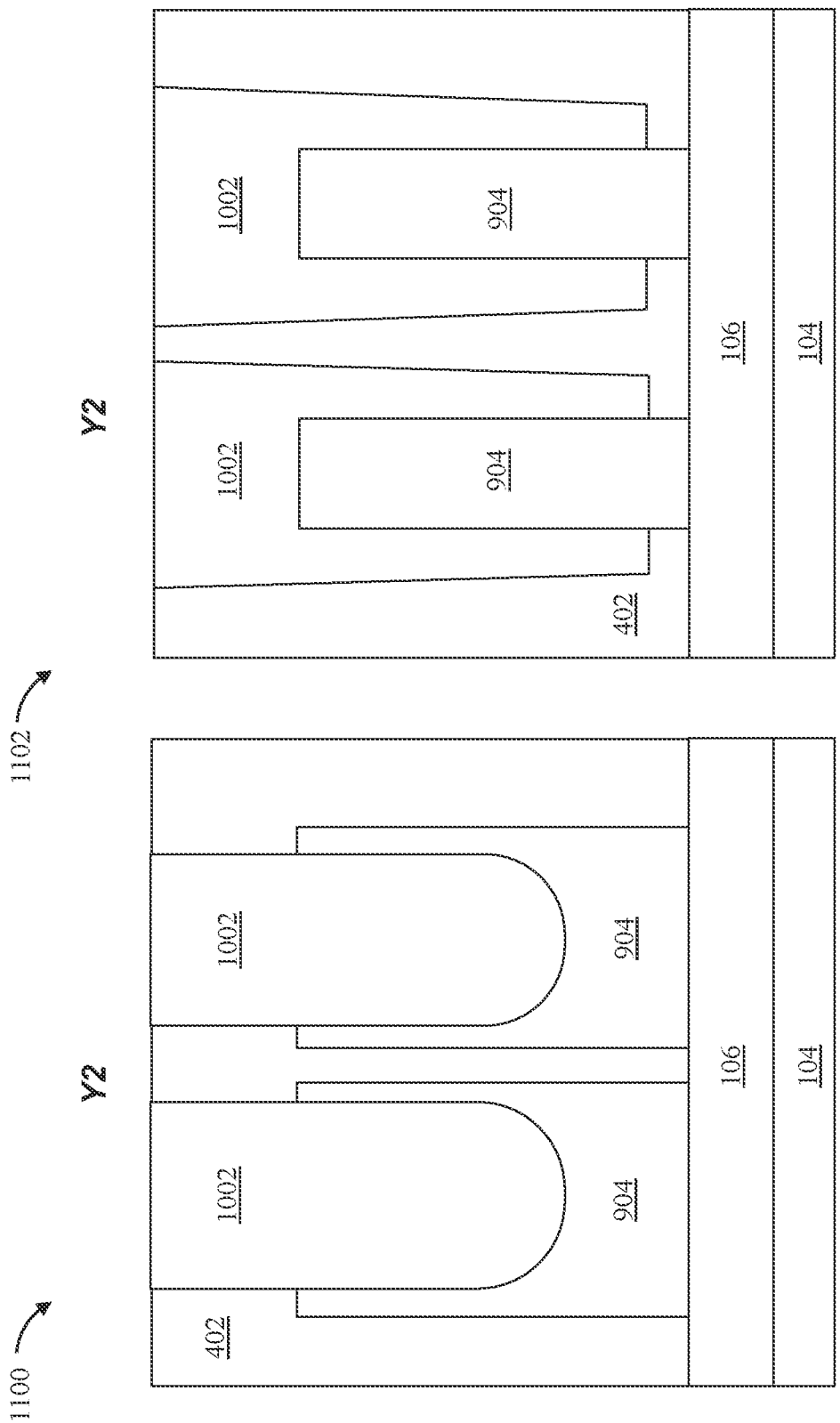
FIG. 11 depicts cross-sectional views of a semiconductor structure along the line Y2 of the reference view according to one or more embodiments of the invention.

FIG. 11 depicts cross-sectional views of a semiconductor structure 1100 and 1102, respectively, taken along the line Y2 (along gates in source/drain region) of the reference view 101 after a processing operation according to one or more embodiments of the invention. The semiconductor structure 1100 depicts a first embodiment for the interface between the source/drain contacts 1002 and the source and drain region 904 discussed previously within with respect to the semiconductor structure 100.

As shown in FIG. 11 for the semiconductor structure 1100, in some embodiments of the invention, the source and drain region 904 is relatively wide (large), and the source/drain contacts 1002 extend into a top portion of the source and drain region 904. Advantageously, the presence of the dielectric gate structure 204 (shown in the Y1 cut of FIG. 10) mitigates the parasitic capacitance between a large source and drain region 904 and the gates 112.

As shown in FIG. 11 for the semiconductor structure 1102, in some embodiments of the invention, the source and drain region 904 is relatively small, while the source/drain contacts 1002 are relatively large, extending over sidewalls of the source and drain region 904. Advantageously, the presence of the dielectric gate structure 204 (shown in the Y1 cut of FIG. 10) mitigates the parasitic capacitance between a large source/drain contacts 1002 and the gates 112.

FIGS. 12-23 depict cross-sectional views of a semiconductor structure 1200 taken along the lines X and Y1 of the reference view 101 after a processing operation according to one or more embodiments of the invention. The semiconductor structure 1200 illustrates an alternative embodiment to the semiconductor structure 100 shown in FIGS. 1-11. As discussed previously herein, the semiconductor structure 100 greatly reduces unwanted gate-to-silicide and gate-to-contact capacitance. One potential concern with the gate configuration shown for the semiconductor structure 100 (see FIG. 10) is an increase in gate resistance for the top sheets of the nanosheet stack 102 caused due to the increased distance between the conductive bridge (i.e., the portion of the gate 112 that extends under the gate contact 1004, sometimes referred to as a metal liner bridge) and the portion of the bulk gate which surrounds the topmost nanosheets. This potential for increased gate resistance is even greater as the number of sheets in the nanosheet stack increases.

The embodiment shown with respect to the semiconductor structure 1200 addresses the potential for increased gate resistance by further reducing gate-to-silicide and gate-to-contact capacitance and by balancing the gate resistance by repositioning the conductive bridge. In this configuration, one side of the nanosheets are anchored directly to the dielectric and the metal bridge is raised to a more centralized position with respect to the nanosheet stack.

Figure 12:
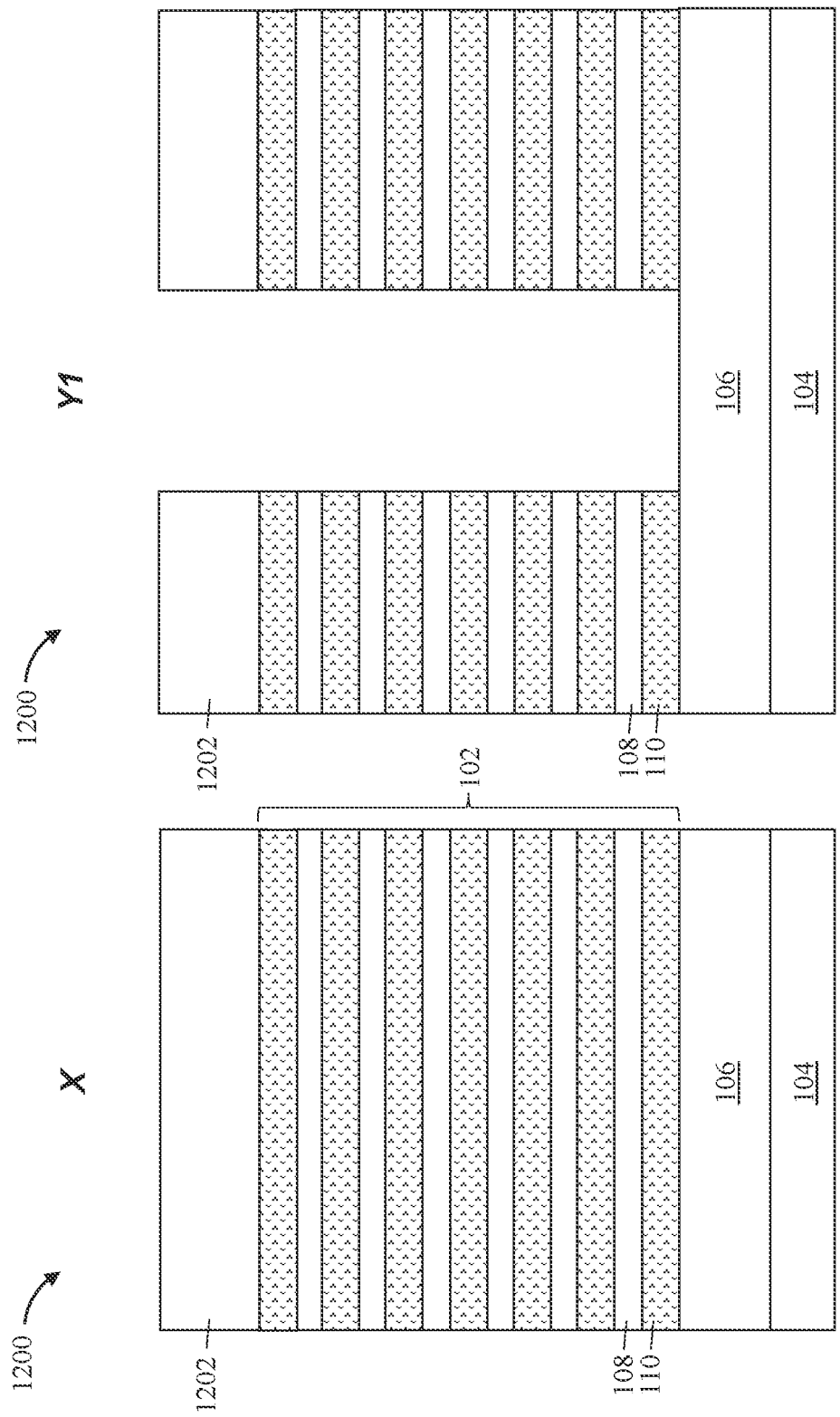
FIG. 12 depicts cross-sectional views of a semiconductor structure along the lines X and Y1 of the reference view after an initial set of processing operations according to one or more embodiments of the invention.

FIG. 12 depicts cross-sectional views of the semiconductor structure 1200 taken along the lines X and Y1 of the reference view 101 after an initial set of fabrication operations have been applied as part of a method of fabricating a final semiconductor device according to one or more embodiments of the invention. The semiconductor structure 1200 can include one or more nanosheet stacks 102 formed over a substrate 104 and a buried oxide layer 106, configured and arranged as shown. The nanosheet stacks 102, substrate 104, and buried oxide layer 106 can be formed in a similar manner as discussed with respect to the semiconductor structure 100 shown in FIG. 1. In some embodiments of the invention, a hard mask 1202 is patterned over the semiconductor structure 1200 and portions of the nanosheet stacks 102 are removed to expose a surface of the buried oxide layer 106.

Figure 13:
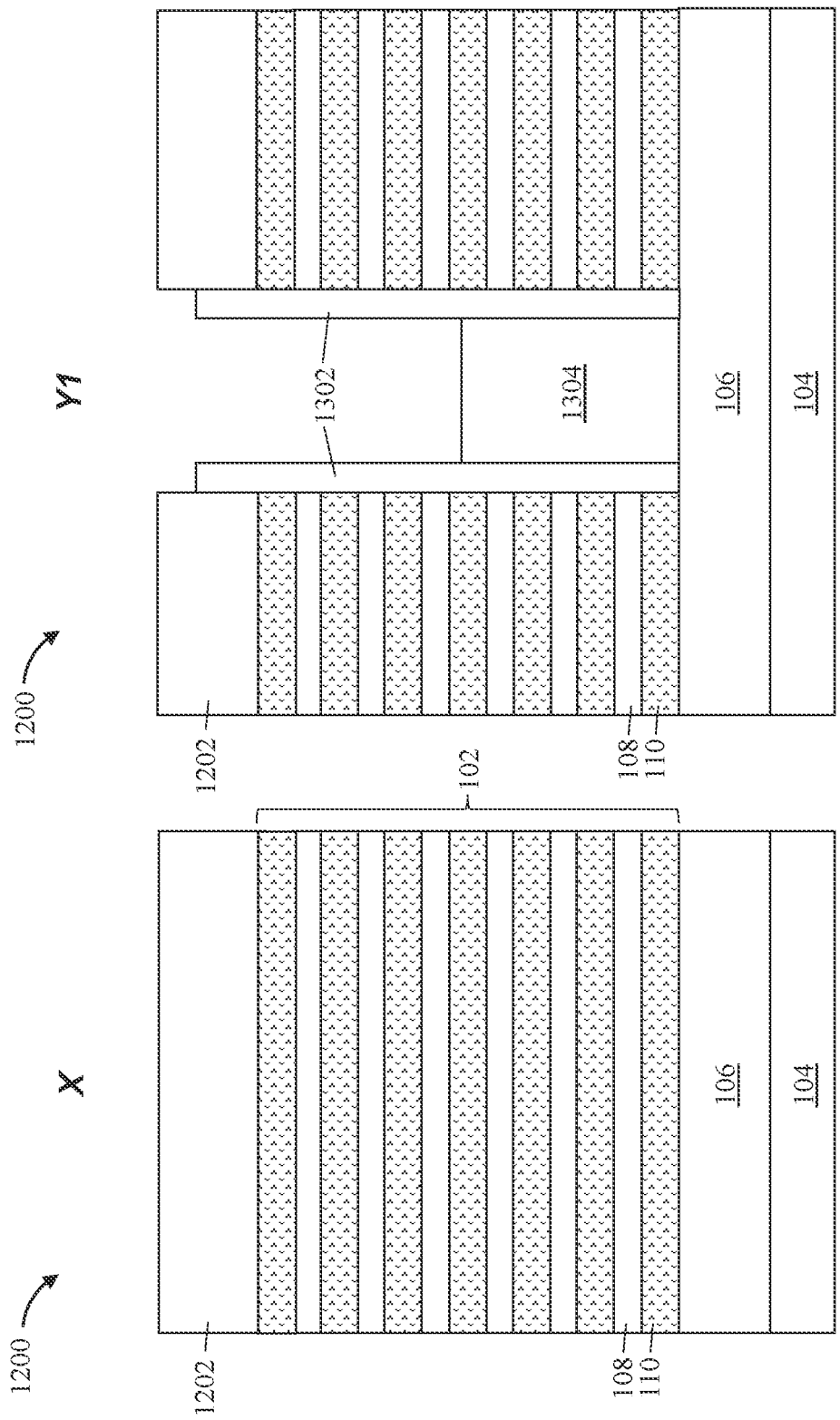
FIG. 13 depicts cross-sectional views of a semiconductor structure along the lines X and Y1 of the reference view according to one or more embodiments of the invention.

FIG. 13 depicts cross-sectional views of the semiconductor structure 1200 taken along the lines X and Y1 of the reference view 101 after a processing operation according to one or more embodiments of the invention. In some embodiments of the invention, a spacer layer 1302 is formed on sidewalls of the nanosheet stacks 102. In some embodiments of the invention, the spacer layer 1302 is a semiconductor layer (e.g., SiGe) that is epitaxially grown from the exposed sidewalls of the sacrificial layers 110 in the nanosheet stacks 102.

As further shown in FIG. 13, a first dielectric gate structure 1304 is formed on the buried oxide layer 106. In some embodiments of the invention, the first dielectric gate structure 1304 is recessed to expose sidewalls of the spacer layer 1302. The first dielectric gate structure 1304 can be made of any suitable dielectric material, such as, for example, oxides, a low-k dielectric, nitrides, silicon nitride, silicon oxide, SiON, SiC, SiOCN, and SiBCN.

Figure 14:
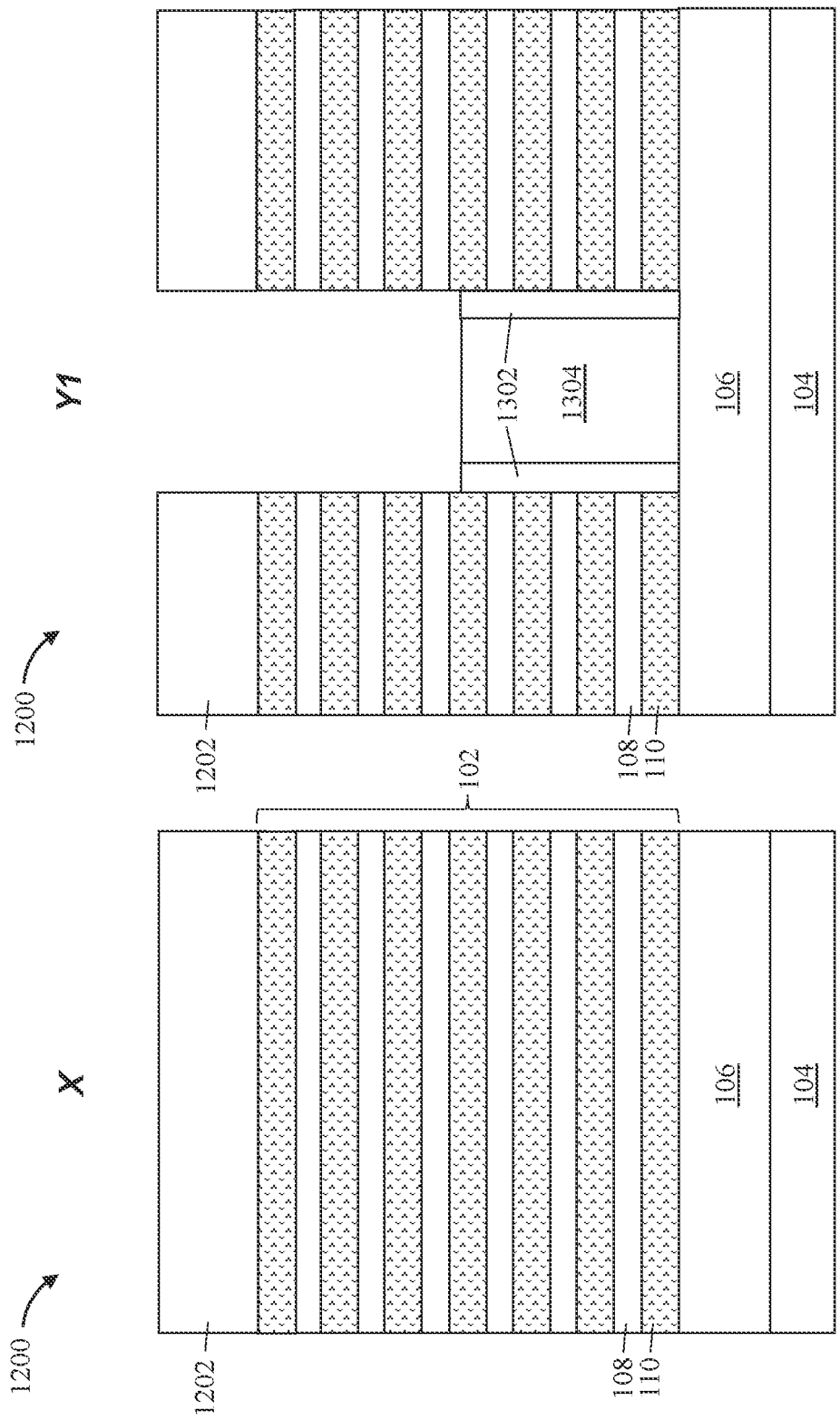
FIG. 14 depicts cross-sectional views of a semiconductor structure along the lines X and Y1 of the reference view according to one or more embodiments of the invention.

FIG. 14 depicts cross-sectional views of the semiconductor structure 1200 taken along the lines X and Y1 of the reference view 101 after a processing operation according to one or more embodiments of the invention. In some embodiments of the invention, the spacer layer 1302 is recessed to a surface of the first dielectric gate structure 1304. The spacer layer 1302 can be recessed using, for example, a wet etch, a dry etch, or a combination of wet and/or dry etches. In some embodiments of the invention, the spacer layer 1302 is recessed using an isotropic etch back (e.g., a SiGe isotropic etch).

Figure 15:
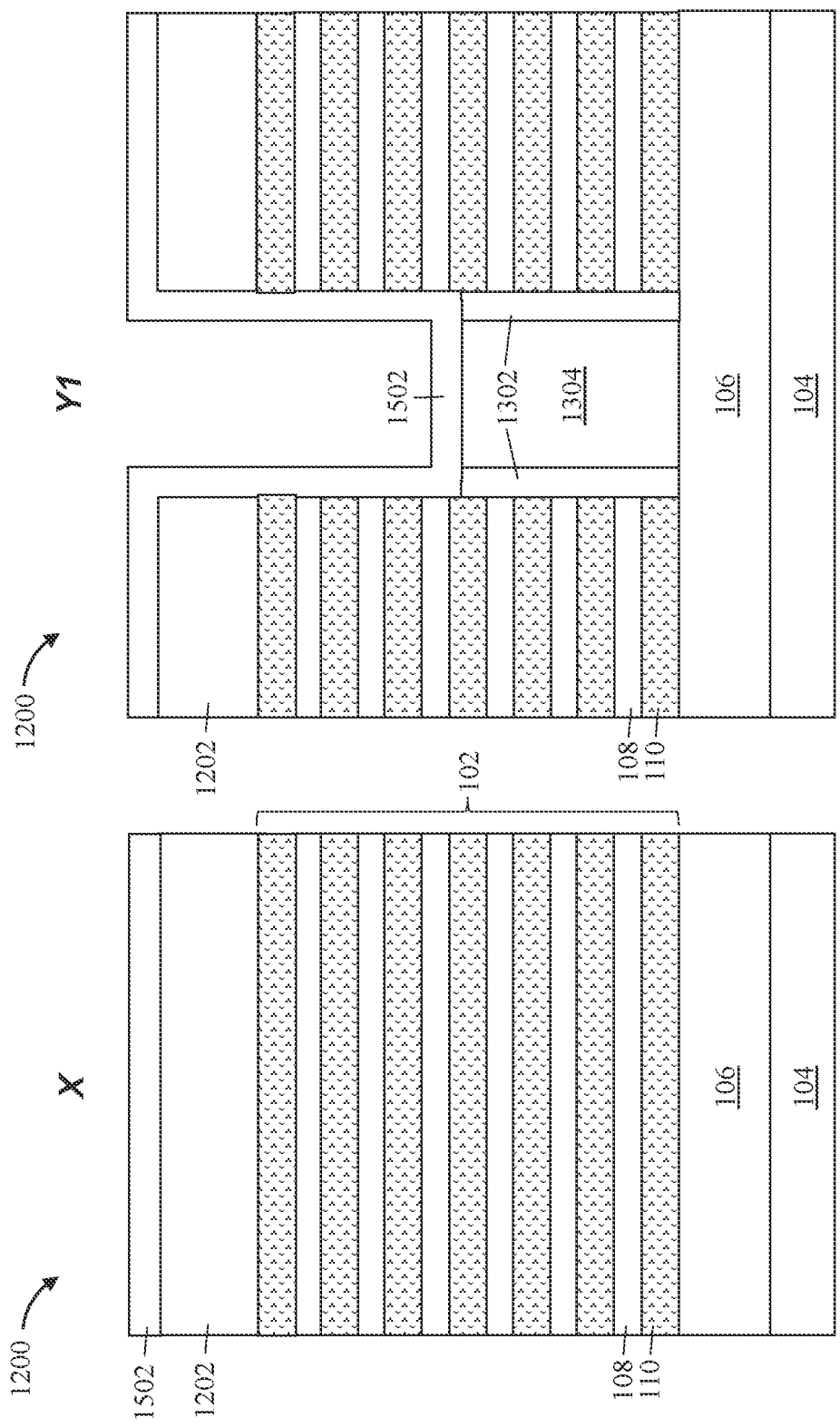
FIG. 15 depicts cross-sectional views of a semiconductor structure along the lines X and Y1 of the reference view according to one or more embodiments of the invention.

FIG. 15 depicts cross-sectional views of the semiconductor structure 1200 taken along the lines X and Y1 of the reference view 101 after a processing operation according to one or more embodiments of the invention. In some embodiments of the invention, a sacrificial liner 1502 is formed on sidewalls of the nanosheet stacks 102 and on a surface of the first dielectric gate structure 1304. In some embodiments of the invention, the sacrificial liner 1502 is a semiconductor layer (e.g., SiGe) that is conformally deposited over the semiconductor structure 1200 or epitaxially grown from the exposed sidewalls of the sacrificial layers 110 in the nanosheet stacks 102.

Figure 16:
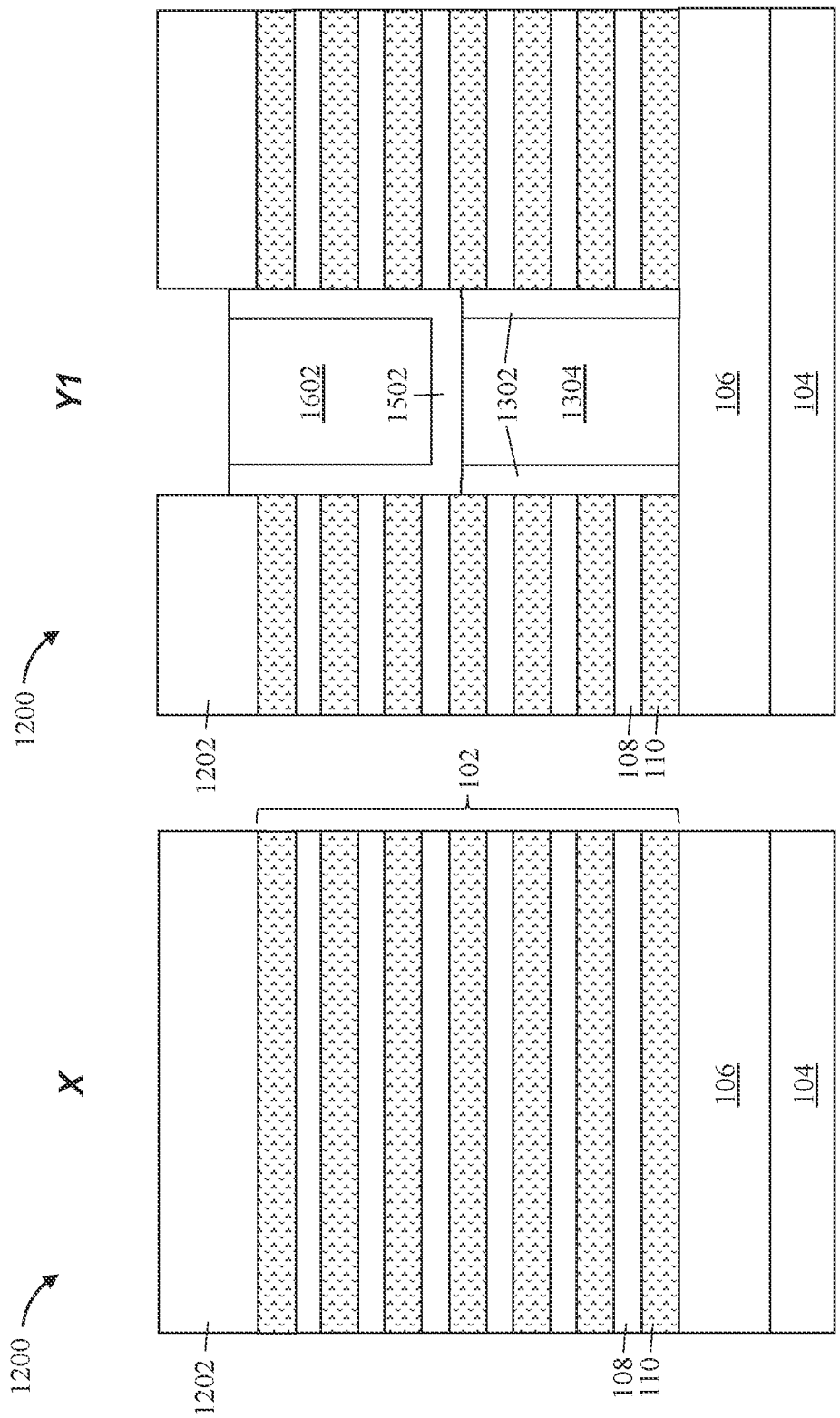
FIG. 16 depicts cross-sectional views of a semiconductor structure along the lines X and Y1 of the reference view according to one or more embodiments of the invention.

FIG. 16 depicts cross-sectional views of the semiconductor structure 1200 taken along the lines X and Y1 of the reference view 101 after a processing operation according to one or more embodiments of the invention. In some embodiments of the invention, an organic planarization layer (OPL) 1602 is formed on the sacrificial liner 1502.

In some embodiments, the OPL 1602 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 1602 can include any organic polymer and a photo-active compound having a molecular structure that can attach to the molecular structure of the organic polymer. In some embodiments, the OPL 1602 material is selected to be compatible an overlying antireflective coating (not shown) and/or an overlying photoresist (not shown). In some embodiments, the OPL 1602 can be applied using spin coating technology, although other techniques are within the contemplated scope of the invention.

As shown in line Y1 in FIG. 16, the OPL 1602 can be recessed using, for example, a dry etch, or a combination of sequential dry and/or wet etches. In some embodiments of the invention, the sacrificial liner 1502 is chamfered to the recessed surface of the OPL 1602.

Figure 17:
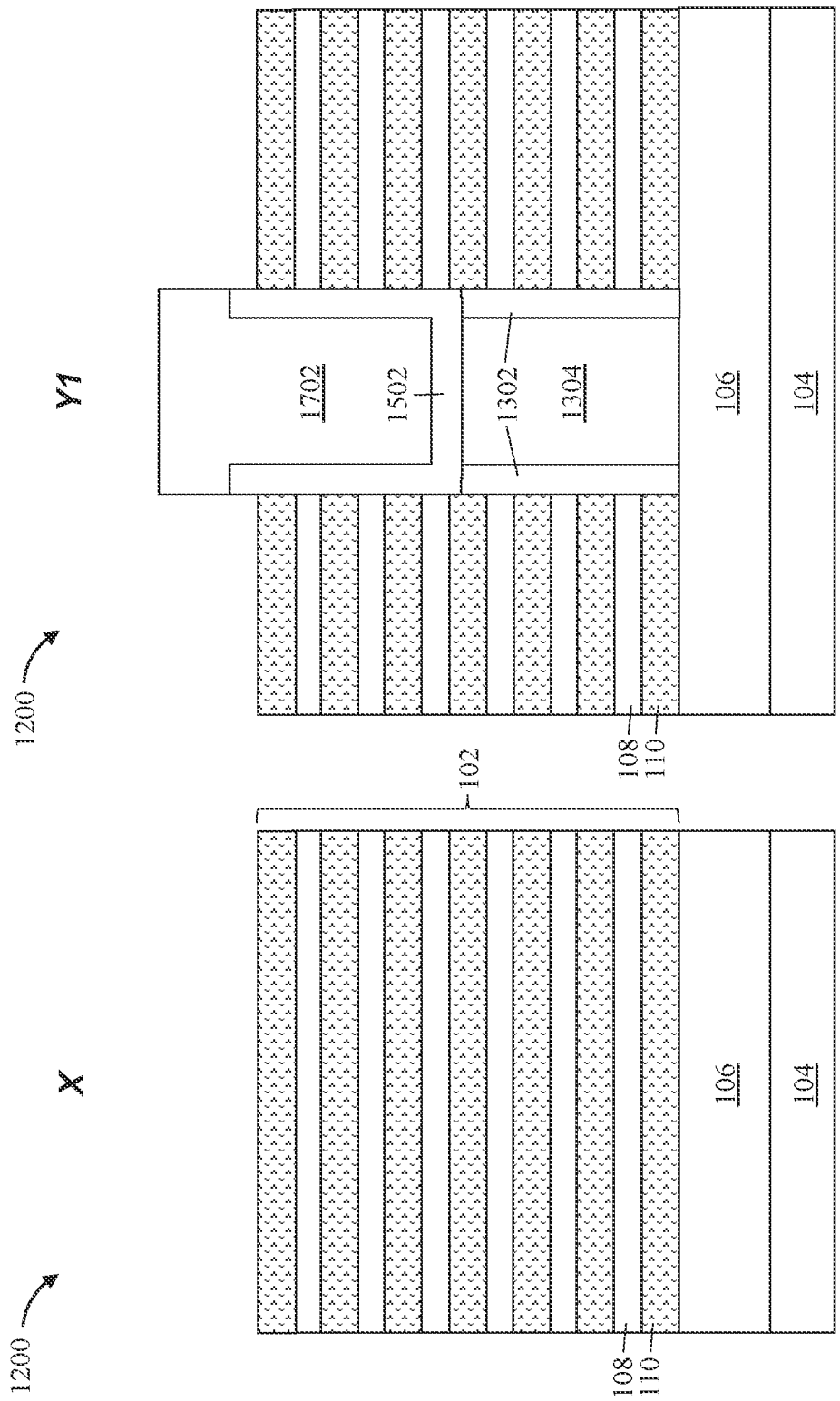
FIG. 17 depicts cross-sectional views of a semiconductor structure along the lines X and Y1 of the reference view according to one or more embodiments of the invention.

FIG. 17 depicts cross-sectional views of the semiconductor structure 1200 taken along the lines X and Y1 of the reference view 101 after a processing operation according to one or more embodiments of the invention. In some embodiments of the invention, the OPL 1602 is removed and replaced with a second dielectric gate structure 1702. The second dielectric gate structure 1702 can be made of any suitable dielectric material, such as, for example, oxides, a low-k dielectric, nitrides, silicon nitride, silicon oxide, SiON, SiC, SiOCN, and SiBCN.

In some embodiments of the invention, the OPL 1602 is removed using an ashing process, although other techniques such as wet or dry etching are within the contemplated scope of the invention. In some embodiments of the invention, the second dielectric gate structure 1702 is formed over the sacrificial liner 1502 and the semiconductor structure 1200 is planarized (using, e.g., CMP) to a surface of the hard mask 1202. In some embodiments of the invention, the hard mask 1202 is removed after planarization.

Figure 18:
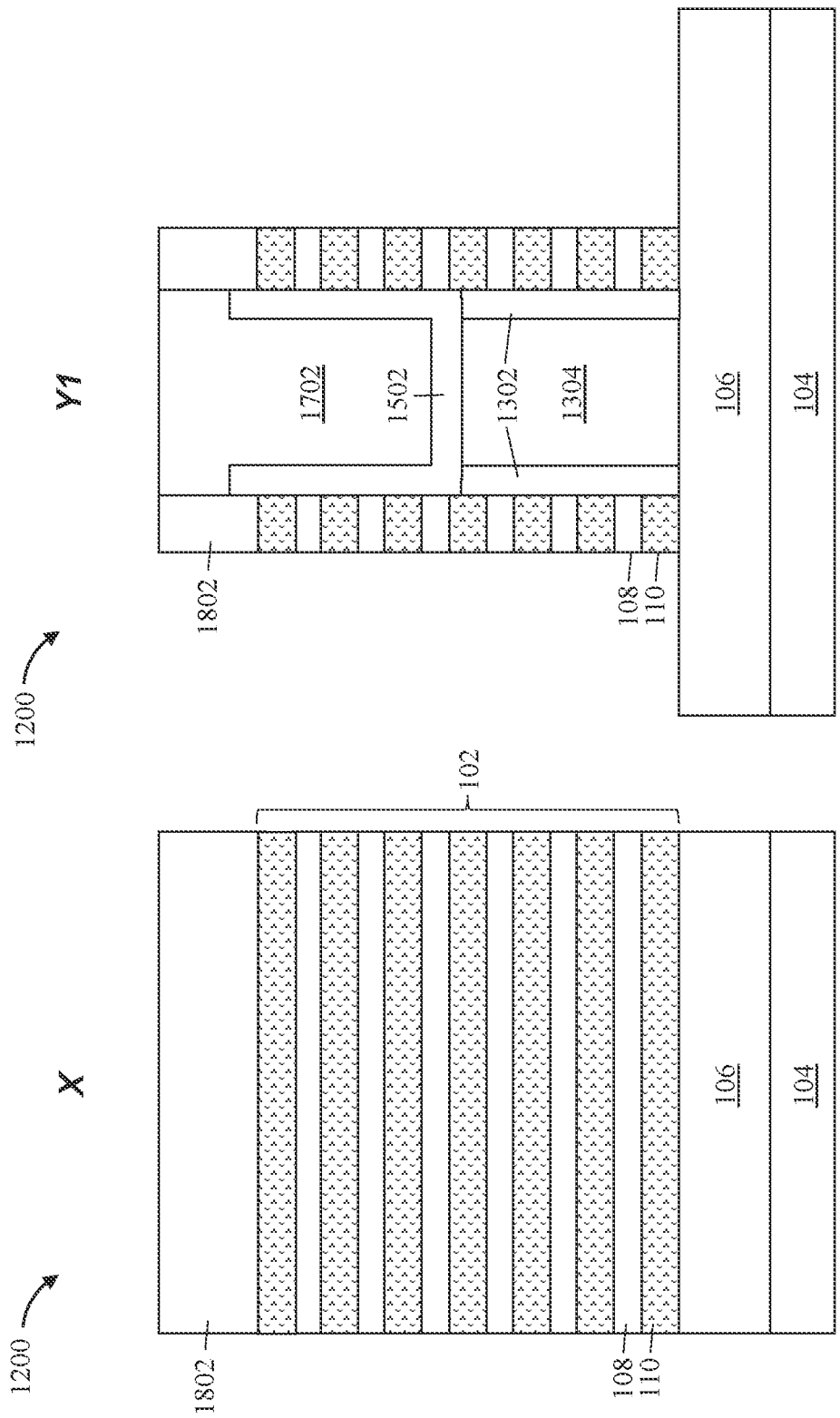
FIG. 18 depicts cross-sectional views of a semiconductor structure along the lines X and Y1 of the reference view according to one or more embodiments of the invention.

FIG. 18 depicts cross-sectional views of the semiconductor structure 1200 taken along the lines X and Y1 of the reference view 101 after a processing operation according to one or more embodiments of the invention. In some embodiments of the invention, a spacer 1802 can be formed over the nanosheet stacks 102. The spacer 1802 can be made of any suitable dielectric material, such as, for example, oxides, a low-k dielectric, nitrides, silicon nitride, silicon oxide, SiON, SiC, SiOCN, and SiBCN.

In some embodiments of the invention, the spacer 1802 can be patterned and portions of the nanosheet stacks 102 can be removed (exposing a surface of the buried oxide layer 106) to define the nanosheet stack width. In some embodiments of the invention, the width of the nanosheet stacks 102 is about 20 nm, although other widths are within the contemplated scope of the invention.

Figure 19:
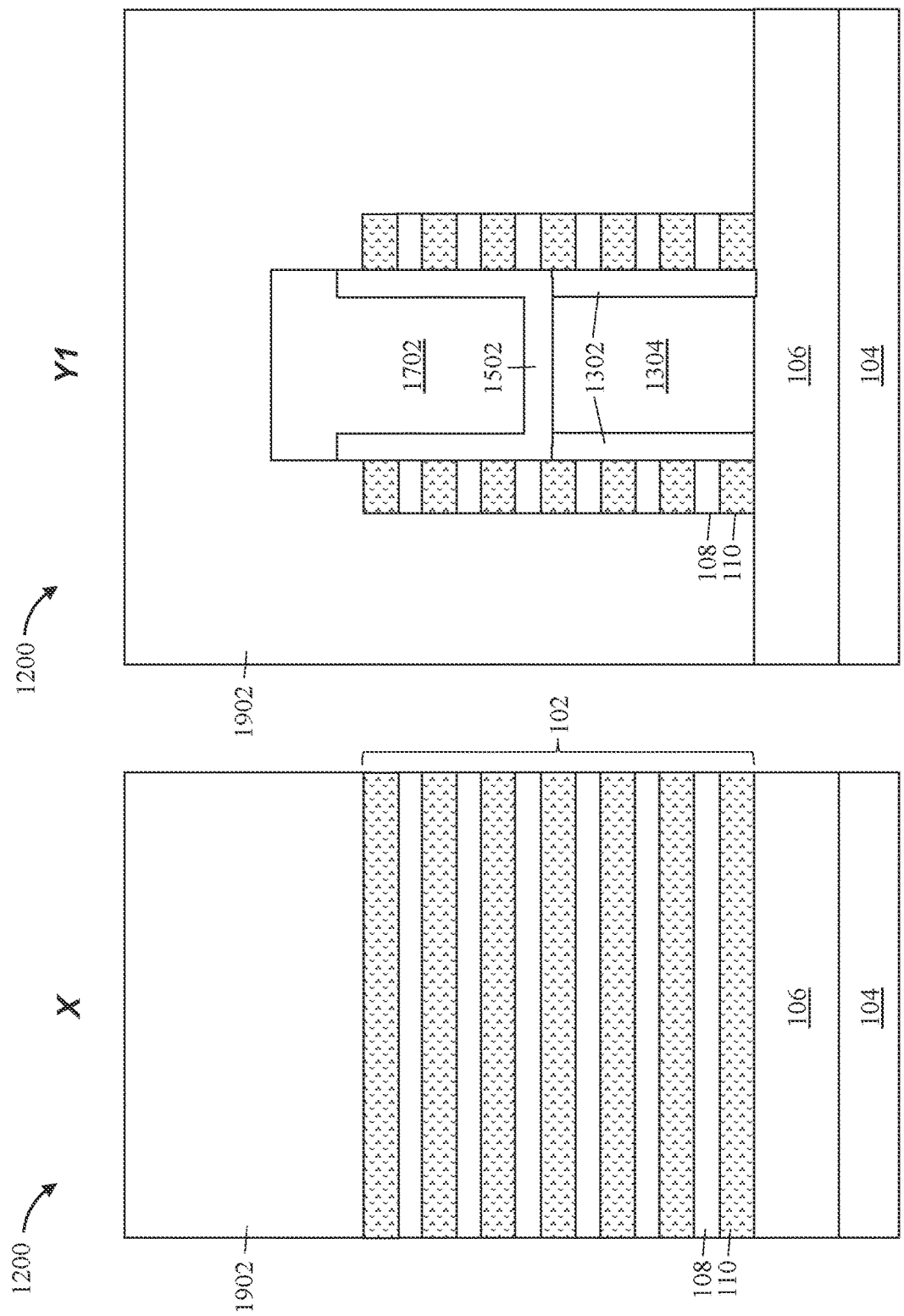
FIG. 19 depicts cross-sectional views of a semiconductor structure along the lines X and Y1 of the reference view according to one or more embodiments of the invention.

FIG. 19 depicts cross-sectional views of the semiconductor structure 1200 taken along the lines X and Y1 of the reference view 101 after a processing operation according to one or more embodiments of the invention. In some embodiments of the invention, the spacer 1802 is removed and a dielectric region 1902 is formed over the semiconductor structure 1200. The dielectric region 1902 can be made of any suitable dielectric material, such as, for example, oxides, a low-k dielectric, nitrides, silicon nitride, silicon oxide, SiON, SiC, SiOCN, and SiBCN. In some embodiments of the invention, the semiconductor structure 1200 is planarized after forming the dielectric region 1902.

Figure 20:
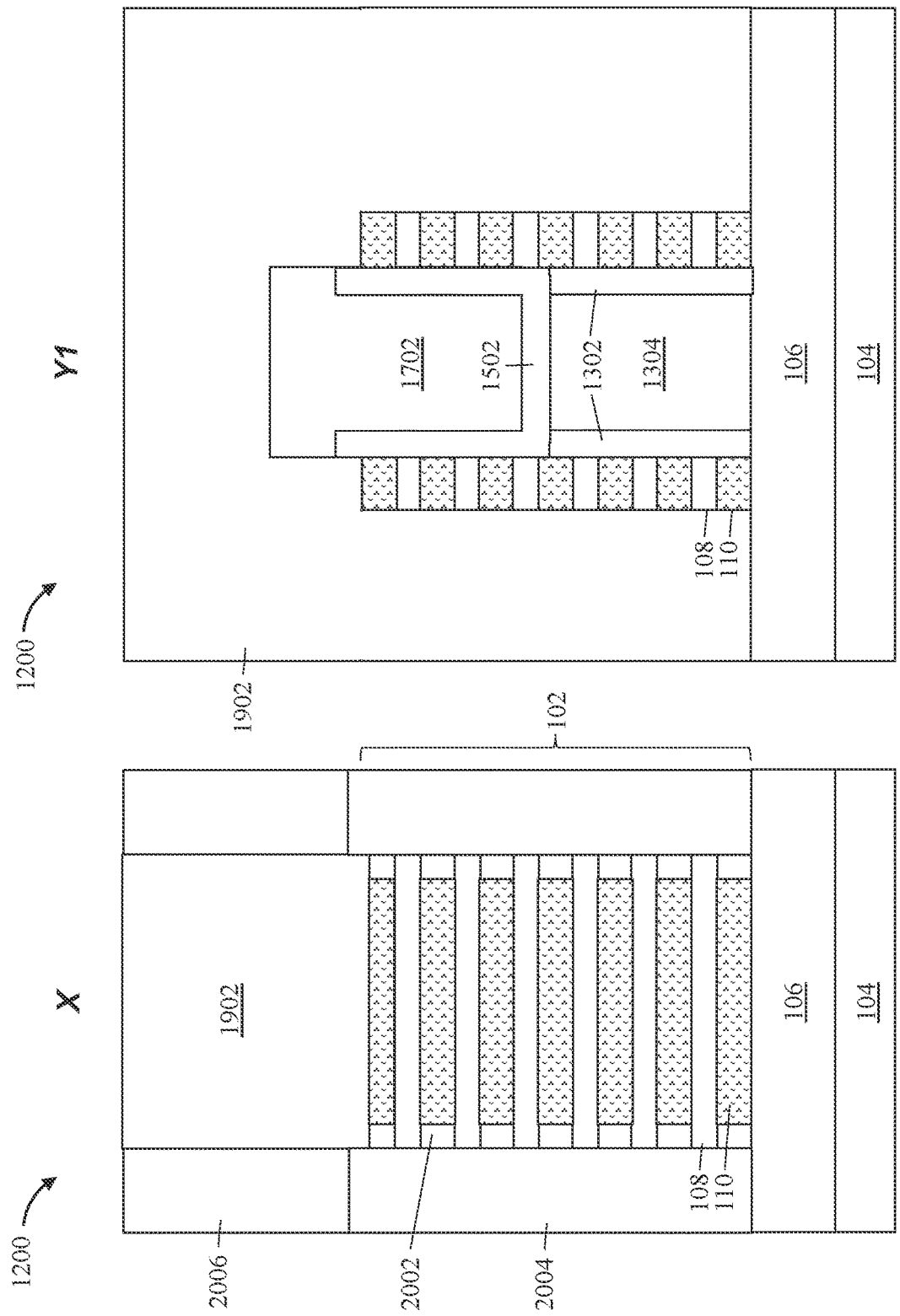
FIG. 20 depicts cross-sectional views of a semiconductor structure along the lines X and Y1 of the reference view according to one or more embodiments of the invention.

FIG. 20 depicts cross-sectional views of the semiconductor structure 1200 taken along the lines X and Y1 of the reference view 101 after a processing operation according to one or more embodiments of the invention. In some embodiments of the invention, portions of the nanosheet stacks 102 are removed (sometimes referred to as a gate mandrel patterning), the sacrificial layers 110 can be recessed, and inner spacers 2002 can be formed on the recessed sidewalls of the sacrificial layers 110. In some embodiments of the invention, source and drain regions 2004 are formed on exposed sidewalls of the semiconductor layers 108 and an isolation dielectric 2006 is formed over the source and drain regions 2004. The inner spacers 2002, source and drain regions 2004, and isolation dielectric 2006 can be formed in a similar manner as discussed with respect to the inner spacers 302, source and drain regions 402, and isolation dielectric 404 of the semiconductor structure 100 as shown in FIGS. 3 and 4.

Figure 21:
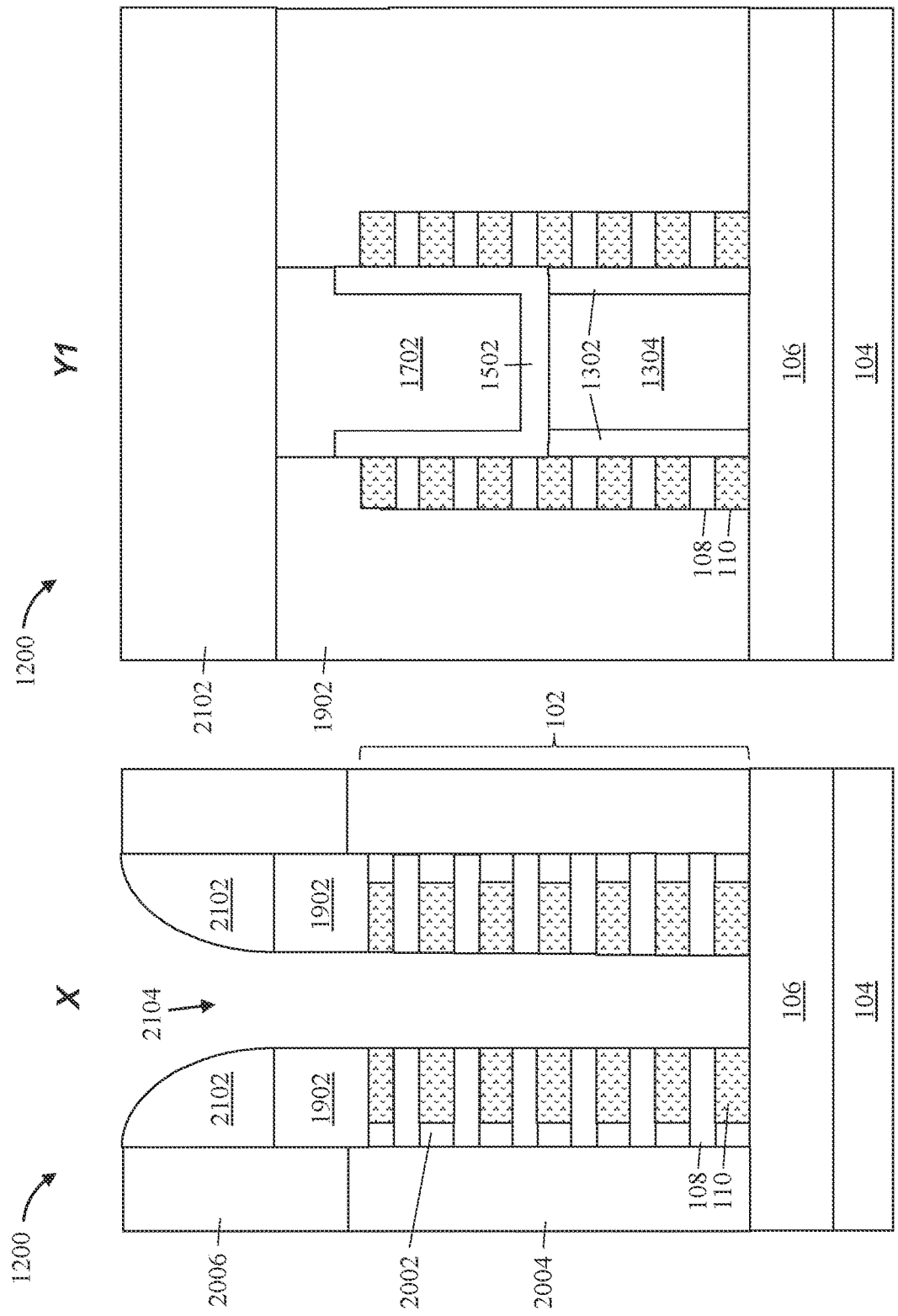
FIG. 21 depicts cross-sectional views of a semiconductor structure along the lines X and Y1 of the reference view according to one or more embodiments of the invention.

FIG. 21 depicts cross-sectional views of the semiconductor structure 1200 taken along the lines X and Y1 of the reference view 101 after a processing operation according to one or more embodiments of the invention. In some embodiments of the invention, the dielectric gate structure 1902 is recessed and a spacer layer 2102 is formed on the recessed surface of the dielectric gate structure 1902, in a similar manner as discussed with respect to the dielectric gate structure 204 and the spacer layer 504 as shown in FIG. 5.

As further shown in FIG. 21, portions of the spacer layer 2102, the semiconductor layers 108, the sacrificial layers 110, and the dielectric gate structure 1902 can be removed (sometimes referred to as a stack recess) to define a gate patterning trench 2104 that exposes a surface of the buried oxide layer 106. Patterning can be accomplished using, for example, a wet etch, a dry etch, or a combination of wet and/or dry etches. In some embodiments of the invention, the semiconductor structure 1200 is patterned using a RIE.

Figure 22:
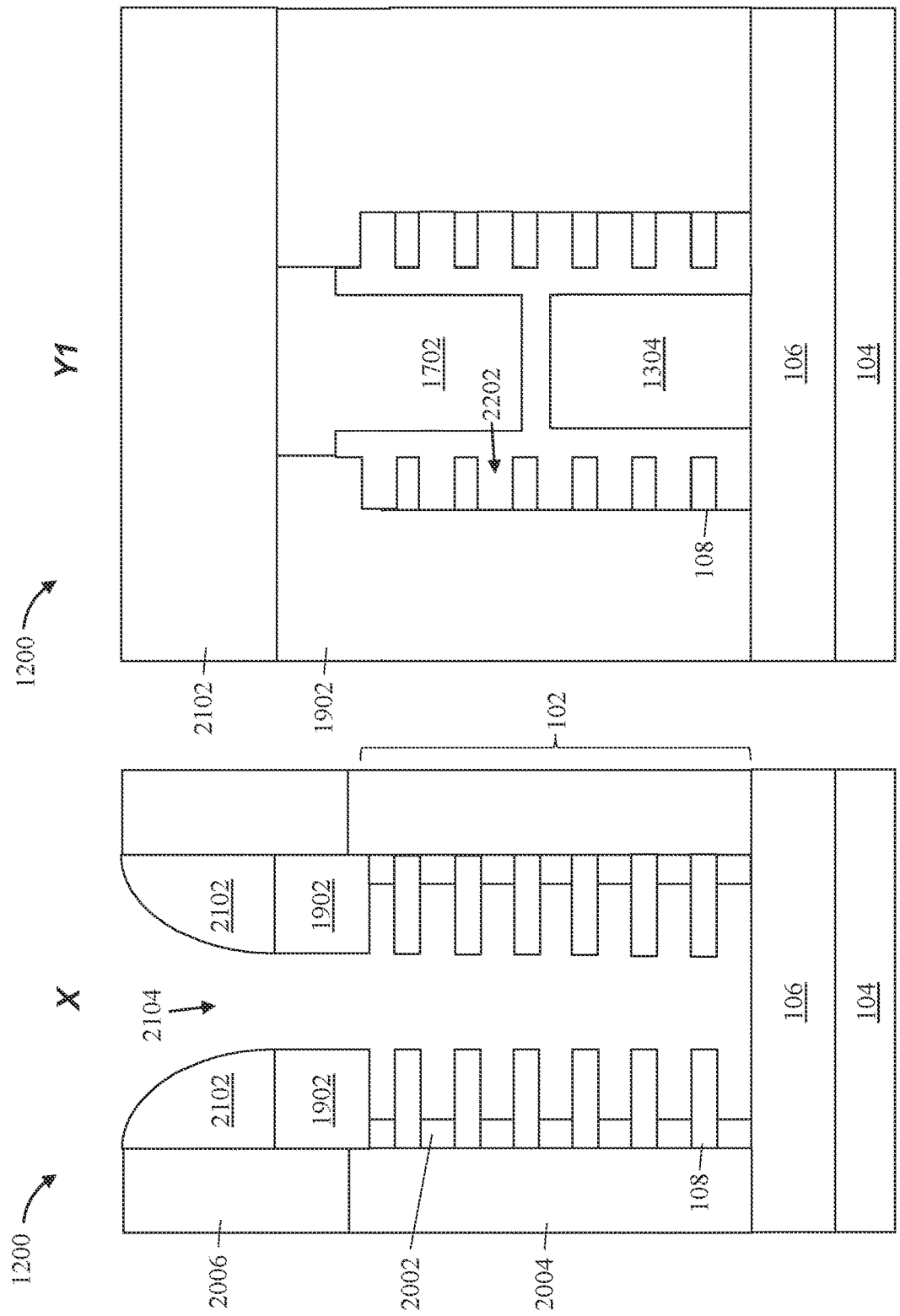
FIG. 22 depicts cross-sectional views of a semiconductor structure along the lines X and Y1 of the reference view according to one or more embodiments of the invention.

FIG. 22 depicts cross-sectional views of the semiconductor structure 1200 taken along the lines X and Y1 of the reference view 101 after a processing operation according to one or more embodiments of the invention. In some embodiments of the invention, the sacrificial layers 110 can be removed to form a cavity 2202 that releases the semiconductor layers 108 (once released, the semiconductor layers 108 are often referred to as nanosheets). The sacrificial layers 110 can be removed selective to the semiconductor layers 108. For example, when the semiconductor layers 108 are formed of silicon and the sacrificial liner 202 and the sacrificial layers 110 are formed of SiGe, carboxylic acid/ nitric acid/HF chemistry, citric acid/nitric acid/HF, and vapor phased HCl, for example, can be utilized to remove SiGe selective to silicon. In another example, when the semiconductor layers 108 are formed of SiGe and the sacrificial liner 202 and the sacrificial layers 110 are formed of silicon, aqueous hydroxide chemistry, including ammonium hydroxide and potassium hydroxide, for example, can be utilized to remove silicon selective to SiGe.

Figure 23:
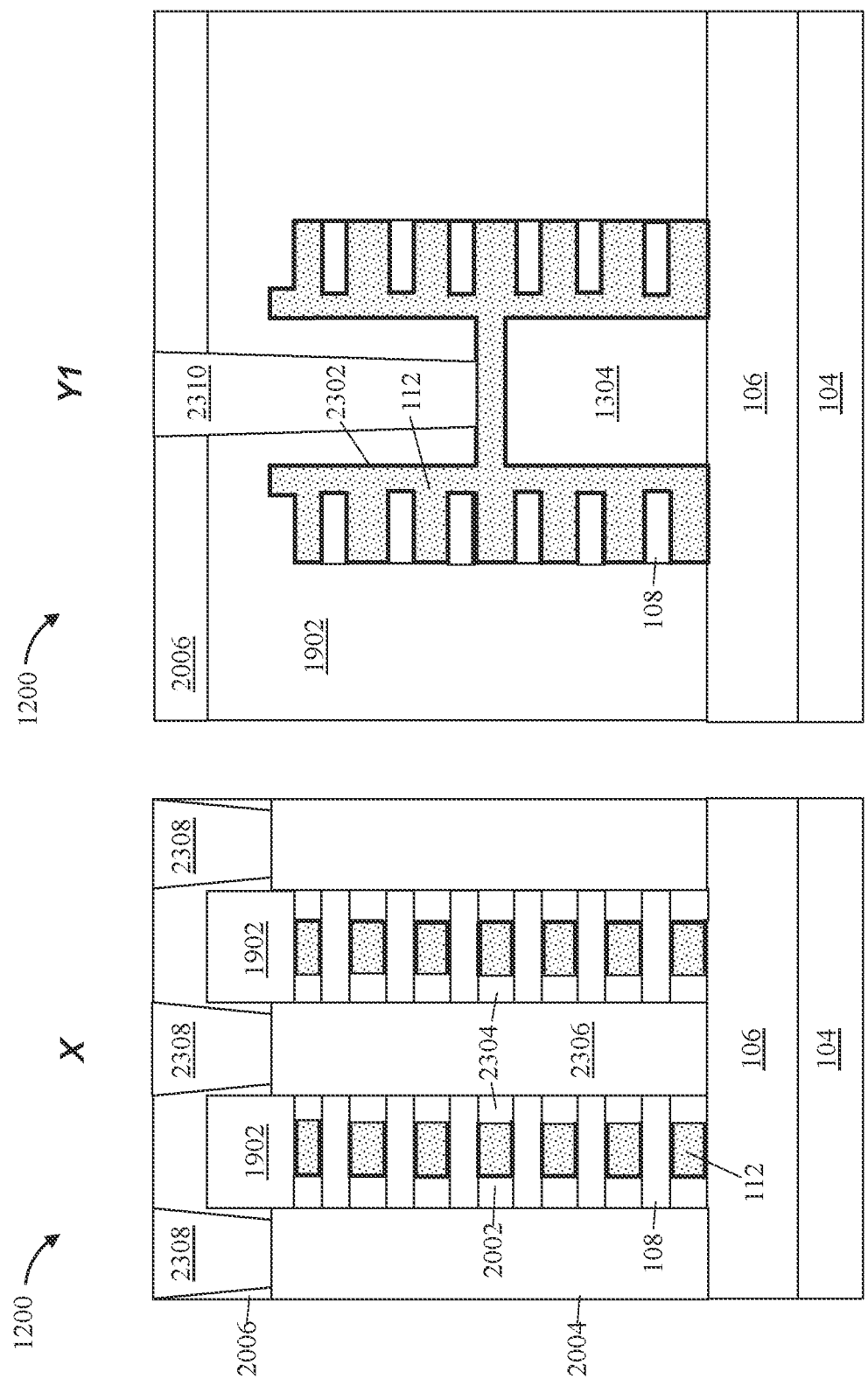
FIG. 23 depicts cross-sectional views of a semiconductor structure along the lines X and Y1 of the reference view according to one or more embodiments of the invention.

FIG. 23 depicts cross-sectional views of the semiconductor structure 1200 taken along the lines X and Y1 of the reference view 101 after a processing operation according to one or more embodiments of the invention. In some embodiments of the invention, a gate dielectric 2302, a gate 112, inner spacers 2304, a source and drain region 2306, source/ drain contacts 2308, and a gate contact 2310 can be formed and arranged in a similar manner as discussed with respect to the gate dielectric 702, gate 112, inner spacers 902, source and drain region 904, source/drain contacts 1002, and gate contact 1004 of the semiconductor structure 100 (as shown in FIGS. 7-10).

Figure 24:
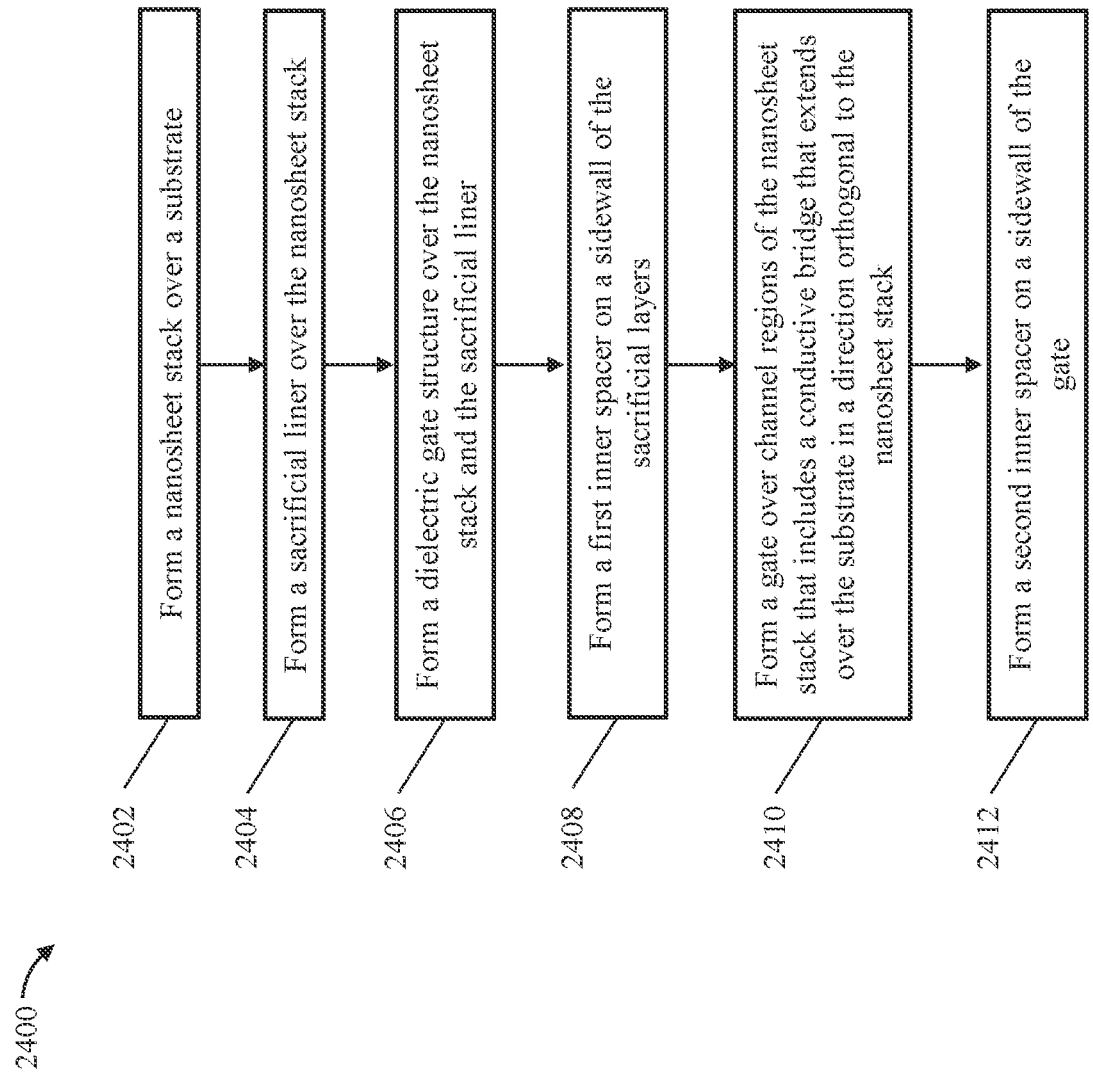
FIG. 24 depicts a flow diagram illustrating a method according to one or more embodiments of the invention.

FIG. 24 depicts a flow diagram 2400 illustrating a method for forming a semiconductor device according to one or more embodiments of the invention. As shown at block 2402, a nanosheet stack is formed over a substrate. The nanosheet stack can include alternating semiconductor layers and sacrificial layers.

At block 2404, a sacrificial liner is formed over the nanosheet stack. At block 2406, a dielectric gate structure is formed over the nanosheet stack and the sacrificial liner. In some embodiments of the invention, the dielectric gate structure is positioned between the nanosheet stack and the gate contact.

At block 2408, a first inner spacer is formed on a sidewall of the sacrificial layers. In some embodiments of the invention, forming the first inner spacer includes recessing the sacrificial layers.

At block 2410, a gate is formed over channel regions of the nanosheet stack. In some embodiments of the invention, the gate includes a conductive bridge that extends over the substrate in a direction orthogonal to the nanosheet stack. In some embodiments of the invention, forming the gate includes removing a portion of the nanosheet stack and the dielectric gate structure to expose sidewalls of the sacrificial layers. In some embodiments of the invention, forming the gate further includes removing the sacrificial liner and the sacrificial layers.

In some embodiments of the invention, forming the gate includes forming a gate dielectric, forming a conductive region over the gate dielectric, and removing exposed portions of the gate dielectric. In some embodiments of the invention, the gate dielectric extends between the first inner spacer and the gate but not between the second inner spacer and the gate. In other words, the gate dielectric is asymmetric. At block 2412, a second inner spacer is formed on a sidewall of the gate.

The method can further include forming a first source or drain region on a sidewall of the first inner spacer and forming a second source or drain region on a sidewall of the second inner spacer. In some embodiments of the invention, a gate contact is formed on a surface of the conductive bridge.

Figure 25:
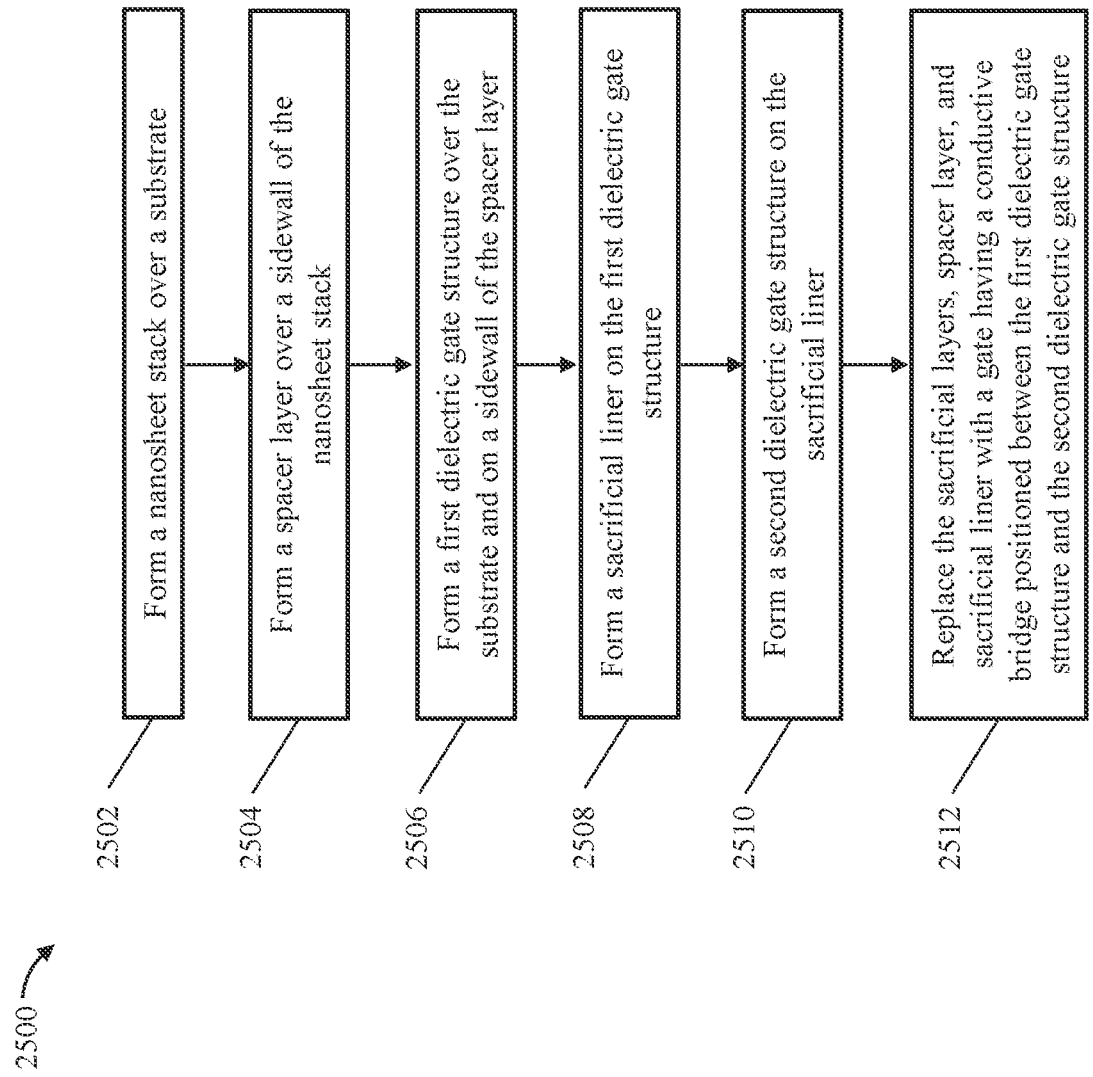
FIG. 25 depicts a flow diagram illustrating a method according to one or more embodiments of the invention.

FIG. 25 depicts a flow diagram 2500 illustrating a method for forming a semiconductor device according to one or more embodiments of the invention. As shown at block 2502, a nanosheet stack is formed over a substrate. The nanosheet stack can include alternating semiconductor layers and sacrificial layers.

At block 2504, a spacer layer is formed over a sidewall of the nanosheet stack. At block 2506, a first dielectric gate structure is formed over the substrate and on a sidewall of the spacer layer. At block 2508, a sacrificial liner is formed on the first dielectric gate structure. At block 2510, a second dielectric gate structure is formed on the sacrificial liner.

At block 2512, the sacrificial layers, spacer layer, and sacrificial liner are replaced with a gate. In some embodiments of the invention, the gate includes a conductive bridge positioned between the first dielectric gate structure and the second dielectric gate structure. In some embodiments of the invention, the conductive bridge is formed directly on a surface of the first dielectric gate structure. In some embodiments of the invention, the second dielectric gate structure is formed directly on the conductive bridge.

In some embodiments of the invention, the gate includes a gate dielectric that extends along a top surface, a bottom surface, and a first sidewall of the semiconductor layers but not along a second sidewall of the semiconductor layers. In other words, the gate dielectric asymmetrically covers the semiconductor layers (nanosheets), leaving one sidewall (surface) of the semiconductor layers uncovered.

The method can include forming a first inner spacer on a sidewall of the sacrificial layers and forming a second inner spacer on a sidewall of the gate. In some embodiments of the invention, a first source or drain region is formed on a sidewall of the first inner spacer and a second source or drain region is formed on a sidewall of the second inner spacer. In some embodiments of the invention, a gate contact is formed on a surface of the conductive bridge. In some embodiments of the invention, the gate contact extends through a portion of the second dielectric gate structure.

In some embodiments of the invention, the semiconductor device includes a second nanosheet stack positioned adjacent to the first nanosheet stack. In some embodiments of the invention, the gate is a shared gate having a first portion and a second portion. In some embodiments of the invention, the first portion is over channel regions of the first nanosheet stack and the second portion is over channel regions of the second nanosheet stack. In some embodiments of the invention, the gate includes a conductive bridge between the first portion and the second portion. In some embodiments of the invention, the conductive bridge is on a surface of the first dielectric gate structure. In some embodiments of the invention, a second dielectric gate structure is on the conductive bridge.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    a nanosheet stack over a substrate; and
    a gate over channel regions of the nanosheet stack, the gate comprising a conductive bridge to a second nanosheet stack, the conductive bridge extending over the substrate in a direction orthogonal to the nanosheet stack, wherein a topmost surface of the conductive bridge is below a topmost surface of a bottommost nanosheet of the nanosheet stack.

2. The semiconductor device of claim 1, further comprising a dielectric gate structure over the nanosheet stack and the gate.

3. The semiconductor device of claim 1, further comprising:
    a first inner spacer on a first end of the nanosheet stack; and
    a second inner spacer on a second end of the nanosheet stack;
    wherein a gate dielectric extends between the first inner spacer and the gate but not between the second inner spacer and the gate.

4. The semiconductor device of claim 3, further comprising a first source or drain region on a sidewall of the first inner spacer.

5. The semiconductor device of claim 4, further comprising a second source or drain region on a sidewall of the second inner spacer.

6. The semiconductor device of claim 2, further comprising a gate contact on a surface of the conductive bridge.

7. The semiconductor device of claim 6, wherein the dielectric gate structure is positioned between the nanosheet stack and the gate contact.

8. A method for forming a semiconductor device, the method comprising:
    forming a nanosheet stack over a substrate; and
    forming a gate over channel regions of the nanosheet stack, the gate comprising a conductive bridge to a second nanosheet stack, the conductive bridge extending over the substrate in a direction orthogonal to the nanosheet stack, wherein a topmost surface of the conductive bridge is below a topmost surface of a bottommost nanosheet of the nanosheet stack.

9. The method of claim 8, further comprising forming a dielectric gate structure over the nanosheet stack and the gate.

10. The method of claim 8, further comprising:
    forming a first inner spacer on a first end of the nanosheet stack; and
    forming a second inner spacer on a second end of the nanosheet stack;
    wherein a gate dielectric extends between the first inner spacer and the gate but not between the second inner spacer and the gate.

11. The method of claim 10, further comprising forming a first source or drain region on a sidewall of the first inner spacer.

12. The method of claim 11, further comprising a second source or drain region on a sidewall of the second inner spacer.

13. The method of claim 9, further comprising a gate contact on a surface of the conductive bridge.

14. The method of claim 13, wherein the dielectric gate structure is positioned between the nanosheet stack and the gate contact.

* * * * *